(12) United States Patent
Lin et al.

(10) Patent No.: US 10,373,916 B2
(45) Date of Patent: Aug. 6, 2019

(54) SEMICONDUCTOR DEVICE PACKAGES

(71) Applicant: UNIVERSAL SCIENTIFIC INDUSTRIAL (SHANGHAI) CO., LTD., Shanghai (CN)

(72) Inventors: Ji-Min Lin, Shanghai (CN); Ming-Wen Liao, Shanghai (CN); Chun-Ying Huang, Shanghai (CN)

(73) Assignee: UNIVERSAL SCIENTIFIC INDUSTRIAL (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/222,820

(22) Filed: Jul. 28, 2016

(65) Prior Publication Data

US 2018/0033736 A1 Feb. 1, 2018

(51) Int. Cl.
*H01L 23/552* (2006.01)
*H01L 23/31* (2006.01)
*H01L 23/64* (2006.01)

(52) U.S. Cl.
CPC ........ *H01L 23/552* (2013.01); *H01L 23/3114* (2013.01); *H01L 23/645* (2013.01); *H01L 23/3121* (2013.01); *H01L 2224/16225* (2013.01); *H01L 2924/181* (2013.01)

(58) Field of Classification Search
CPC . H01L 2224/48091; H01L 2924/00014; H01L 2224/48227; H01L 2224/49175; H01L 23/13; H01L 23/49827; H01L 23/5222; H01L 23/552; H01L 23/642; H01L 23/66; H01L 2924/15153; H01L 2924/15184; H01L 23/645; H01L 23/3114; H01L 2924/181; H01L 2224/16225; H01L 23/3121

See application file for complete search history.

(56) References Cited

U.S. PATENT DOCUMENTS

| | | | | |
|---|---|---|---|---|
| 4,838,475 A | | 6/1989 | Mullins et al. | |
| 4,967,315 A | * | 10/1990 | Schelhorn | H05K 5/0095 174/377 |
| 5,166,772 A | * | 11/1992 | Soldner | H01L 23/3121 257/659 |
| 5,355,016 A | * | 10/1994 | Swirbel | G11C 16/18 257/659 |
| 5,530,202 A | | 6/1996 | Dais et al. | |
| 5,614,694 A | | 3/1997 | Gorenz et al. | |

(Continued)

FOREIGN PATENT DOCUMENTS

| | | |
|---|---|---|
| CN | 1138287 A | 12/1996 |
| CN | 101617400 A | 12/2009 |

(Continued)

OTHER PUBLICATIONS

Office Action and Search Report from Corresponding Chinese Patent Application No. 201610964631.4, dated May 20, 2019, 10 pages.

*Primary Examiner* — Edward Chin
(74) *Attorney, Agent, or Firm* — Foley & Lardner LLP; Cliff Z. Liu

(57) ABSTRACT

A semiconductor device package includes a substrate, a component on a surface of the substrate, a package body encapsulating the component, and an electromagnetic interference (EMI) shield conformally formed on the package body, where the EMI shield has a side portion defining an opening.

19 Claims, 21 Drawing Sheets

(56) References Cited

U.S. PATENT DOCUMENTS

| | | | | |
|---|---|---|---|---|
| 5,639,989 A | * | 6/1997 | Higgins, III | H01L 23/552 |
| | | | | 174/386 |
| 5,698,818 A | * | 12/1997 | Brench | G06F 1/182 |
| | | | | 174/383 |
| 7,629,674 B1 | | 12/2009 | Foster | |
| 8,362,597 B1 | * | 1/2013 | Foster | H01L 21/56 |
| | | | | 257/659 |
| 8,597,979 B1 | * | 12/2013 | Burgyan | H01L 23/3121 |
| | | | | 257/686 |
| 9,129,954 B2 | * | 9/2015 | Yen | H01L 23/498 |
| 9,269,673 B1 | * | 2/2016 | Lin | H01L 23/552 |
| 9,635,789 B2 | * | 4/2017 | English | H05K 9/0024 |
| 2002/0154493 A1 | * | 10/2002 | Kopf | G11B 33/14 |
| | | | | 361/816 |
| 2007/0210082 A1 | | 9/2007 | English et al. | |
| 2009/0152688 A1 | * | 6/2009 | Do | H01L 23/552 |
| | | | | 257/659 |
| 2009/0236700 A1 | * | 9/2009 | Moriya | H01L 23/29 |
| | | | | 257/659 |
| 2014/0210065 A1 | * | 7/2014 | Nishimura | H01L 23/5222 |
| | | | | 257/676 |
| 2014/0252595 A1 | | 9/2014 | Yen et al. | |
| 2015/0048907 A1 | * | 2/2015 | Almgren | H04B 5/0031 |
| | | | | 333/24 R |

FOREIGN PATENT DOCUMENTS

| | | |
|---|---|---|
| CN | 101395980 B | 9/2011 |
| CN | 104037166 A | 9/2014 |
| TW | 200933765 A | 8/2009 |

\* cited by examiner

SEMICONDUCTOR DEVICE PACKAGES

BACKGROUND

1. Technical Field

The present disclosure relates generally to semiconductor device packages. More particularly, the present disclosure relates to semiconductor device packages with an electromagnetic interference shield.

2. Description of the Related Art

Semiconductor devices have become progressively more complex, driven at least in part by a demand for enhanced processing speeds and smaller sizes. While the benefits of enhanced processing speeds and smaller sizes are apparent, these characteristics of semiconductor devices also can create challenges. In particular, higher clock speeds can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If a level of electromagnetic emissions reaching a neighboring semiconductor device is sufficiently high, these emissions can adversely affect the operation of the neighboring semiconductor device. This phenomenon is sometimes referred to as electromagnetic interference (EMI).

One way to reduce EMI is to shield a source semiconductor device or source semiconductor devices within a semiconductor device package. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing a level of emissions that can pass through the casing (and adversely affect semiconductor devices external to the casing). Likewise, when electromagnetic emissions strike an outer surface of the casing, a similar electrical shorting can occur to reduce EMI on semiconductor devices within the casing.

SUMMARY

In one or more embodiments, a semiconductor device package includes a substrate, a component on a surface of the substrate, a package body encapsulating the component, and an EMI shield conformally formed on the package body, where the EMI shield has a side portion defining an opening.

In one or more embodiments, a semiconductor device package includes a substrate and a circuit on a surface of the substrate, where the circuit is configured for operation at a first frequency. A package body encapsulates the circuit. A conformal shield on the package body defines an opening, which results in a resonant frequency of the semiconductor device package being different from the first frequency.

In one or more embodiments, a semiconductor device package includes a substrate, a component on a surface of the substrate, a package body encapsulating the component, and an EMI shield conformally formed on the package body, the EMI shield including an inductor structure.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

As used herein, the singular terms "a," "an," and "the" may include plural referents unless the context clearly dictates otherwise.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

Figure 1:
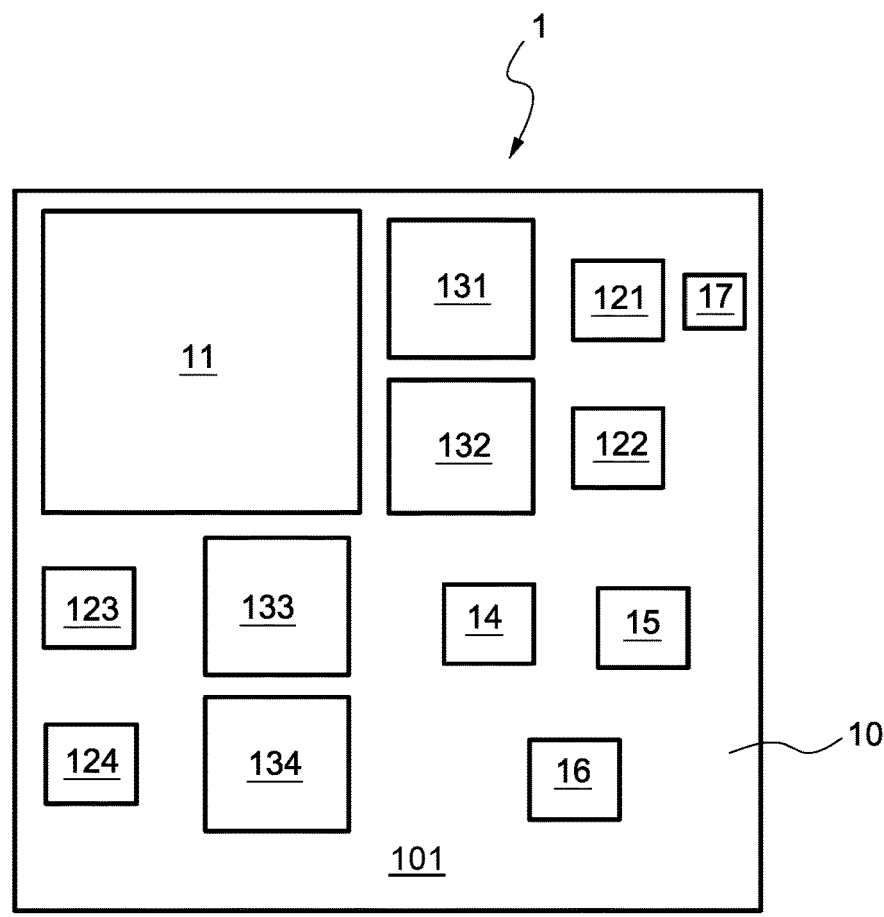
FIG. 1 illustrates a layout view of a communication module in accordance with embodiments of the present disclosure.

FIG. 1 illustrates a layout view of a communication module 1 in accordance with some embodiments of the present disclosure. Communication module 1 may be, for example, but is not limited to, a front end module (FEM) for wireless communication, which may be applied in a system adopting a multiple-input and multiple-output (MIMO) technology. The communication module 1 includes a substrate 10, an integrated circuit (IC) 11, radio frequency (RF) modules 121, 122, 123, 124, power amplifiers 131, 132, 133, 134, an antenna switch module 14, a filter 15, a duplexer 16 and electronic component 17 (representing one or more active or passive components). The IC 11, the RF modules 121, 122, 123, 124, the power amplifiers 131, 132, 133, 134, the antenna switch module 14, the filter 15, the duplexer 16 and the electronic component 17 are disposed on a surface 101 of the substrate 10. The arrangement shown in FIG. 1 is illustrative for purposes of discussion, and other arrangements are encompassed by the present disclosure.

In one or more embodiments, the substrate 10 has dimensions of approximately 14.7 millimeter (mm) by approximately 14.7 mm. In other embodiments, dimensions of the substrate 10 may be different.

The IC 11 is a control device such as a microcontroller unit (MCU) or an RF controller.

In one or more embodiments, the RF modules 121, 122, 123, 124 are designed or are configured by a hardware and/or software setting to operate within a same frequency band. In other embodiments, the RF modules 121, 122, 123, 124 may be designed or configured by a hardware and/or software setting to operate in two or more frequency bands. For example, RF modules 121 and 122 may operate in a 5 gigahertz (GHz) band (e.g., approximately 5.180 GHz to approximately 5.825 GHz) while the RF modules 123 and 124 may operate in a 2.4 GHz band (e.g., approximately 2.412 GHz to approximately 2.472 GHz).

The power amplifiers 131 and 132 may respectively receive and amplify signals from the RF modules 121 and 122. The power amplifiers 133 and 134 may respectively receive and amplify signals from the RF modules 123 and 124.

A package body (not shown in FIG. 1) may be formed on the substrate 10 to encapsulate the IC 11, the RF modules 121, 122, 123, 124, the power amplifiers 131, 132, 133, 134, the antenna switch module 14, the filter 15, the duplexer 16 and the electronic component 17.

Figure 1A:
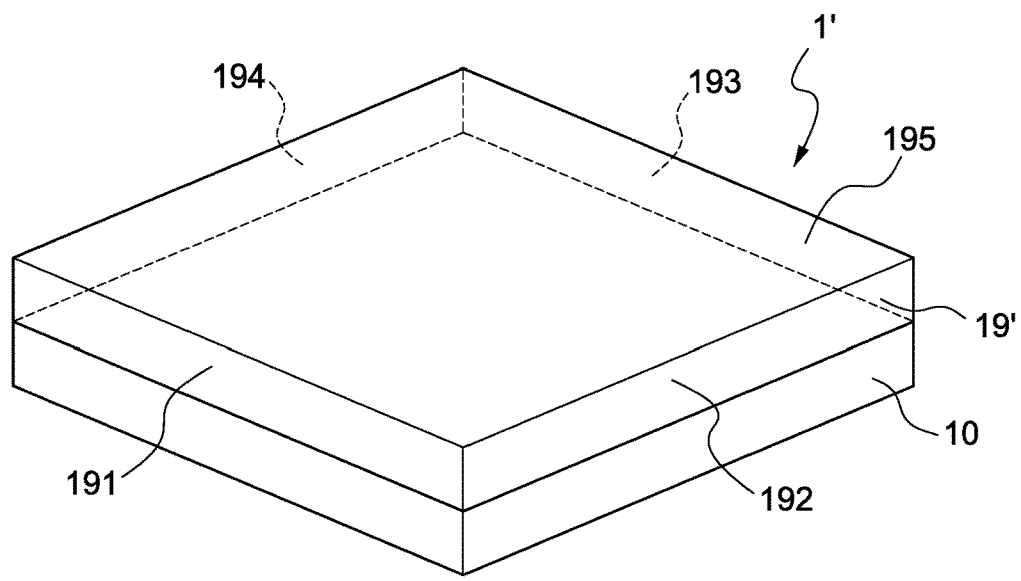
FIG. 1A illustrates a semiconductor device package in accordance with embodiments of the present disclosure.

FIG. 1A illustrates a perspective view of a semiconductor device package 1' in accordance with one or more embodiments of the present disclosure. Semiconductor device package 1' includes the communication module 1 as illustrated and described with reference to FIG. 1, a package body (not separately indicated in FIG. 1A) on the substrate 10 and an EMI shield 19' conformally formed on the package body. The EMI shield 19' has a top portion 195, a side portion 191, a side portion 192, a side portion 193 and a side portion 194.

Circuits of the semiconductor device package 1' may be operated at a working frequency (or frequency of operation) f1, such as in the 2.4 GHz band or the 5 GHz band, or other band (e.g., higher than the 5 GHz band).

The EMI shield 19', which encompasses and encloses the package body, may function as a resonator with resonant frequency frs1 in one or more embodiments, such that noise (unwanted electrical, magnetic or electromagnetic energy) may be resonated to a level that increases an impact of the noise on semiconductor devices within the package body and thus can degrade signal quality, especially for signals having a frequency near the resonant frequency frs1. In other words, for example, if resonant frequency frs1 is close to the frequency of operation f1, signal degradation may result. Degradation in signal quality may result in a loss of information contained in the signals, or a reduced speed of operation capability.

To address this concern, one or more embodiments of the present disclosure incorporate one or more openings strategically positioned in an EMI shield to shift a resonant frequency of the EMI shield away from an expected frequency of operation.

Figure 2:
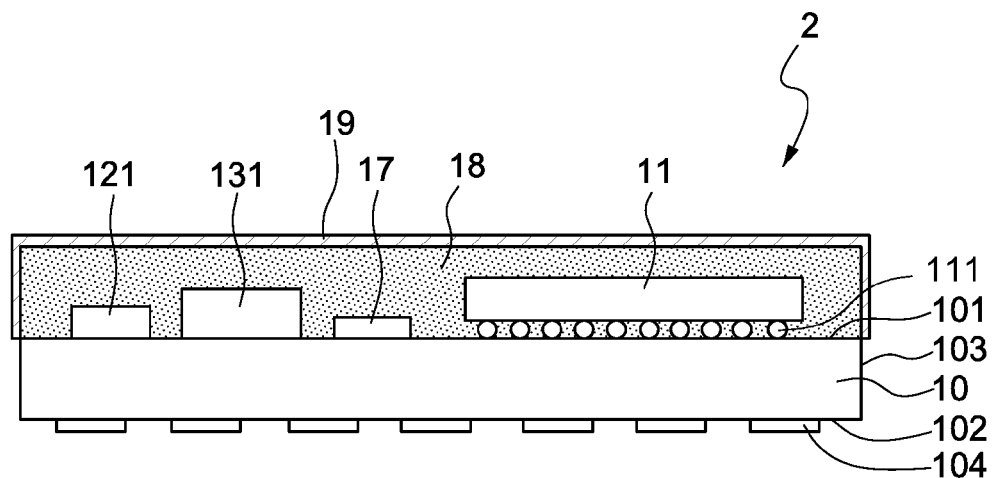
FIG. 2 illustrates a semiconductor device package in accordance with embodiments of the present disclosure.

FIG. 2 illustrates a cross-sectional view of a semiconductor device package 2 in accordance with one or more embodiments of the present disclosure. Semiconductor device package 2 includes a substrate 10, an IC 11, an RF module 121, a power amplifier 131, an electronic component 17, a package body 18 and an EMI shield 19. It is contemplated that the semiconductor device package 2 may also include the RF modules 122, 123, 124, the power amplifiers 132, 133, 134, the antenna switch module 14, the filter 15, and/or the duplexer 16 as shown in FIG. 1, or other components.

The substrate 10 includes a top surface 101 and a bottom surface 102 opposite the top surface 101. The substrate 10 also includes a lateral surface 103 extending between the top surface 101 and the bottom surface 102. The lateral surface 103 is substantially planar and has a substantially orthogonal orientation (or substantially 90° orientation) with respect to the top surface 101 or the bottom surface 102.

The substrate 10 is, for example, a printed circuit board (PCB), such as a paper-based copper foil laminate, a composite copper foil laminate, or a polymer-impregnated glass fiber-based copper foil laminate. The IC 11, the RF module 121, the power amplifier 131 and the electronic component 17 are mounted on the top surface 101 of the substrate 10. The substrate 10 may have electrical interconnects (not shown), such as a redistribution layer (RDL), for electrical connection between the IC 11, the RF module 121, the power amplifier 131 and electronic component 17.

The IC 11 is a flip-chip type die bonded to the substrate 10 (e.g., die bonded to bond pads on the substrate 10 by solder bumps 111). Alternatively (or additionally), the IC 11 may be attached (e.g., to pads) on the substrate 10 through conductive wires.

The semiconductor device package 2 includes electrical contacts 104 disposed on the bottom surface 102 of the substrate 10 for external connection, such as for input/output (I/O), power or ground connections. Some of the electrical contacts 104 are electrically connected to the IC 11, the RF module 121, the power amplifier 131 and electronic component 17 through at least some of the electrical interconnects (not shown in FIG. 2) included in the substrate 10. At least one of the electrical contacts 104 is a ground electrical contact, and is electrically connected to at least some of the electrical interconnects included in the substrate 10.

Circuits in the semiconductor device package 2, (e.g., circuits including the IC 11, the RF module 121, the power amplifier 131, the electronic component 17 and/or other circuits) may be operated at a working frequency (or frequency of operation) f2, which may be, for example, in the 2.4 GHz band or the 5 GHz band, or other frequency band.

The package body 18 is disposed on the top surface 101 of the substrate 10 and covers the IC 11, the RF module 121, the power amplifier 131 and the electronic component 17, to provide mechanical stability as well as protection against oxidation, humidity, and other environmental conditions. The package body 18 may include, for example, an epoxy resin having fillers dispersed therein.

The EMI shield 19 is conformally formed on the package body 18. The EMI shield 19 is electrically connected to a ground layer (not shown in FIG. 2) of the substrate 10, such as by a through molding via (TMV, not shown in FIG. 2). When electromagnetic emissions radiated from an interior of the semiconductor device package 2 reach an inner surface of the EMI shield 19, at least a portion of these emissions can be efficiently grounded, thereby reducing a level of emissions that can pass through the EMI shield 19 and adversely affect neighboring semiconductor devices. Likewise, when electromagnetic emissions external to the semiconductor device package 2 reach an outside surface of the EMI shield 19, the electromagnetic emissions can be efficiently grounded, thereby reducing a level of emissions that can pass through the EMI shield 19 and adversely affect the IC 11, the RF module 121, the power amplifier 131 or electronic component 17 within the semiconductor device package 2.

The EMI shield 19 may provide a resonant frequency frs2 different from the working frequency f2. The EMI shield 19 may provide a resonant frequency frs2 close to multiples of the working frequency f2 but different from multiples of the working frequency f2. The resonant frequency frs2 is also different from the resonant frequency frs1 of the EMI shield 19' as shown in FIG. 1A due to structural differences.

The semiconductor device package 2 can be disposed on a PCB and electrically connected to the PCB via the electrical contacts 104. As previously described, at least one of the electrical contacts 104 is a ground electrical contact, and the ground electrical contact can be electrically connected to a ground voltage provided by the PCB.

Figure 2A:
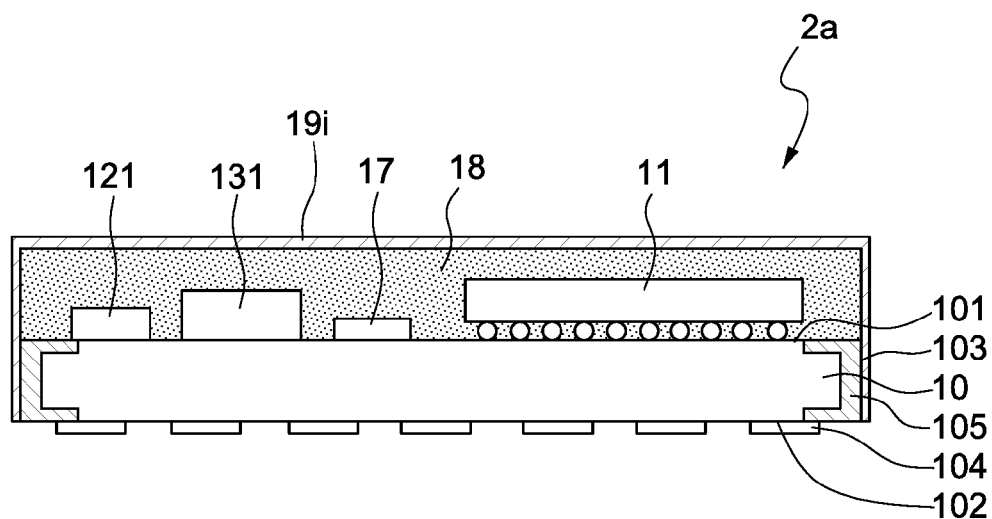
FIG. 2A illustrates a semiconductor device package in accordance with embodiments of the present disclosure.

FIG. 2A illustrates a semiconductor device package 2a in accordance with one or more embodiments of the present disclosure. The semiconductor device package 2a is similar to the semiconductor device package 2 as illustrated and described with reference to FIG. 2, except that the substrate 10 includes vias 105 extending from the first surface 101 to the second surface 102 of the substrate 10. The vias 105 are disposed adjacent to a periphery of the substrate 10, and specifically the vias 105 are disposed adjacent to the lateral surface 103 of the substrate 10 and are exposed by the lateral surface 103. The vias 105 may be grounding segments. The vias 105 are electrically connected to at least some of the electrical interconnects included in the substrate 10 and provide electrical pathways to reduce EMI. The vias 105 are formed from a metal, a metal alloy, or another suitable electrically conductive material.

The package body 18 is disposed on the top surface 101 of the substrate 10 and covers the IC 11, the RF module 121, the power amplifier 131 and electronic component 17, a portion of the top surface 101 of the substrate 10 and an upper surface of the vias 105, so as to provide mechanical stability as well as protection against oxidation, humidity, and other environmental conditions.

An EMI shield 19i is similar to the EMI shield 19 as illustrated and described with reference to FIG. 2, except that the EMI shield 19i further extends downwardly along sides of the semiconductor device package 2a to cover the lateral surface 103 of the substrate 10 and to contact the vias 105.

Figure 3:
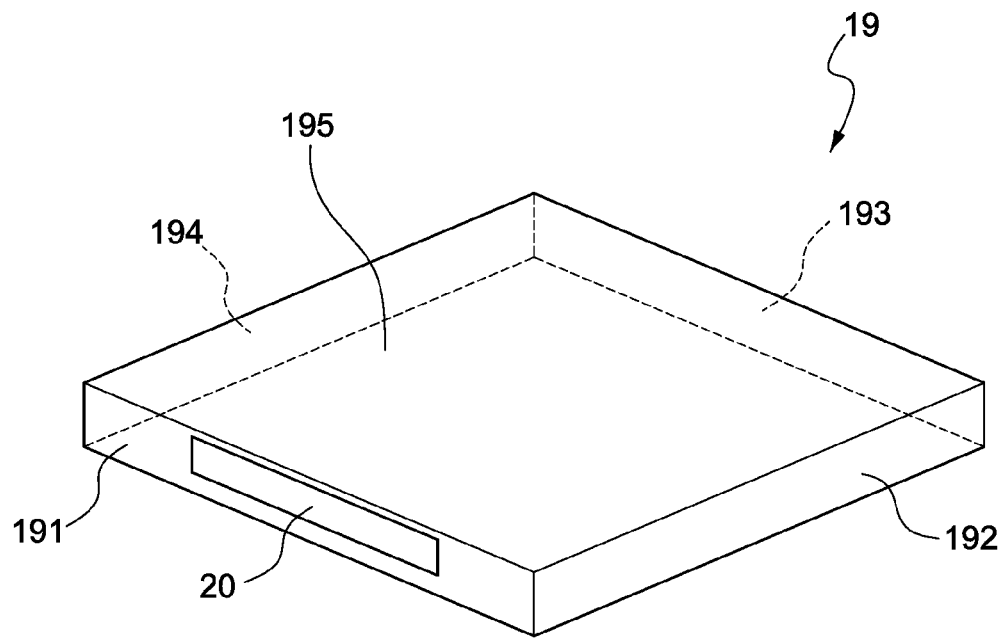
FIG. 3 illustrates an EMI shield in accordance with embodiments of the present disclosure.

FIG. 3 illustrates a perspective view of an EMI shield 19 in accordance with one or more embodiments of the present disclosure. Referring to FIG. 3, the EMI shield 19 has a top portion 195, a side portion 191, a side portion 192, a side portion 193 and a side portion 194. The EMI shield 19 is similar to the EMI shield 19' as illustrated and described with reference to FIG. 1A, except that the side portion 191 defines an opening 20. In one or more embodiments, rather than the opening 20 being defined on the side portion 191 as shown, the opening 20 may be defined on the top portion 195 of the EMI shield 19, such as above one of or a group of components (e.g., components such as the IC 11, the RF module 121, the power amplifier 131 and the electronic component 17 on the top surface 101 of the substrate 10 in FIG. 1, 2 or 2A). It is contemplated that one or more additional openings, other than the opening 20, may be formed on the EMI shield 19. The opening 20 may provide a break in the EMI shield 19 to leave selected components unshielded. Alternatively, the opening 20 may be designed to shift a resonant frequency of the shield 19 to reduce noise (unwanted electrical, magnetic or electromagnetic energy) received at the shield 19.

Figure 3A:
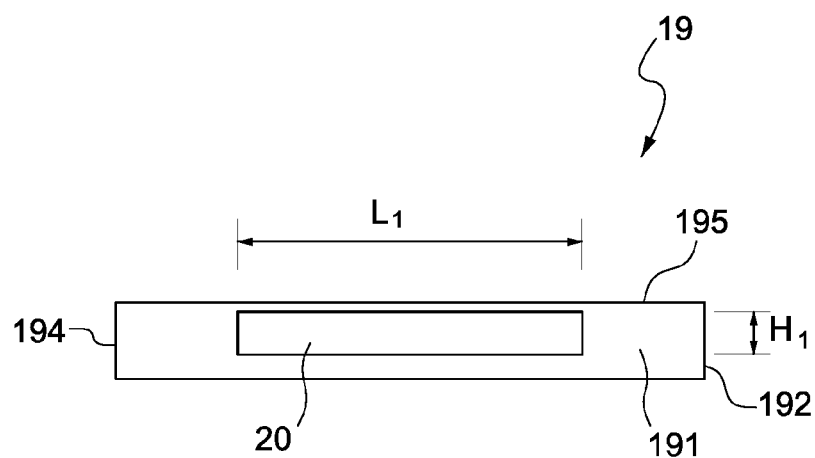
FIG. 3A illustrates an enlarged view of a portion of the EMI shield of FIG. 3 in accordance with embodiments of the present disclosure.

FIG. 3A illustrates an enlarged view of a portion of the EMI shield 19 of FIG. 3 in accordance with one or more embodiments of the present disclosure. Generally, to shift the resonant frequency of the shield 19, the opening 20 has a length $L_1$ and a height $H_1$, and the length $L_1$ is greater than the height $H_1$. For example, for a frequency of operation in the 5 GHz frequency band, simulation results indicate that an opening having a length ($L_1$) from approximately 1.5 mm to approximately 8.0 mm is effective to reduce noise in the 5 GHz frequency band. In one or more embodiments, the opening 20 has a length $L_1$ of approximately 1.5 mm and a height $H_1$ of approximately 0.8 mm. In other embodiments, the opening 20 has a length $L_1$ of approximately 8.0 mm and a height $H_1$ of approximately 0.8 mm. Other $L_1/H_1$ arrangements are also encompassed by the present disclosure.

The length $L_1$ may be determined by solving equations relating to operating frequency. With respect to a frequency of operation in the 5 GHz frequency band, for example, which is approximately 5.180 GHz to approximately 5.825 GHz, the length $L_1$ may be determined in one or more embodiments by the inequality $0.026\lambda \leq L_1 \leq 0.155\lambda$, where $\lambda$ is a wavelength of a frequency of operation of the semiconductor device package 2 within the 5 GHz frequency band. Thus, if the frequency of operation of the semiconductor device package 2 is 5.180 GHz (wavelength of approximately 57.9 mm), then the length $L_1$ may be determined by $0.026\lambda \leq L_1 \leq 0.139\lambda$, which is approximately 1.5 mm to approximately 8.0 mm at 5.180 GHz. Similarly, if the frequency of operation of the semiconductor device package 2 is 5.825 GHz (wavelength of approximately 51.5 mm), then the length $L_1$ may be determined by $0.029\lambda \leq L_1 \leq 0.155\lambda$, which is approximately 1.5 mm to approximately 8.0 mm at 5.825 GHz.

Figure 3B:
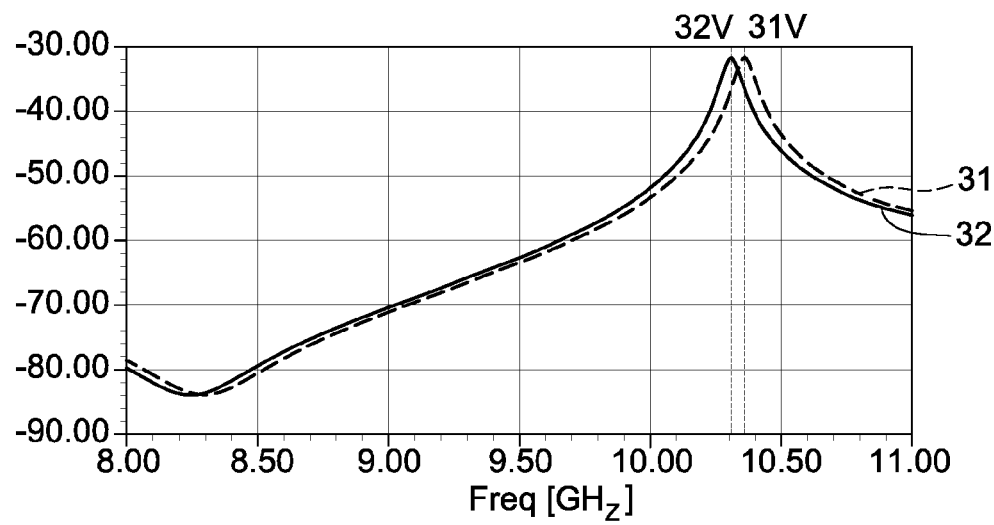
FIG. 3B plots frequency responses of different semiconductor device packages in accordance with embodiments of the present disclosure.

FIG. 3B plots frequency responses of different semiconductor device packages in accordance with embodiments of the present disclosure. A dotted line 31 represents a frequency response of the semiconductor device package 1' in FIG. 1A, and a line 32 represents a frequency response of the semiconductor device package 2 having the EMI shield 19 with the opening 20 as shown FIG. 3, with a length $L_1$ of approximately 1.5 mm and a height $H_1$ of approximately 0.8 mm. The vertical axis of the plot in FIG. 3B represents coupling power of any two conductive lines/ports in a semiconductor device package, for example, coupling power of the input and the output of the power amplifier 131 in the semiconductor device package 2 of FIG. 2.

Referring to the dotted line 31, a peak 31V shows that the dotted line 31 has a relative maximum coupling power of approximately −32 decibels (dB) at a frequency of approximately 10.36 GHz.

Referring to the line 32, a peak 32V shows that the line 32 has a relative maximum coupling power of approximately −32 dB at a frequency of approximately 10.31 GHz. The line 32 has a coupling power of approximately −35 dB at a frequency of approximately 10.36 GHz.

Comparing the peak 31V with the peak 32V, the resonant frequency is shifted from approximately 10.36 GHz to approximately 10.31 GHz due to a structural change from the EMI shield 19' (FIG. 1A) to the EMI shield 19 (FIG. 3) by way of the opening 20. When the semiconductor device package 1' (FIG. 1A) has a frequency of operation of 5.18 GHz, for example, noise included in signals may be resonated at approximately 10.36 GHz (twice the frequency of operation). When the semiconductor device package 2 (FIG. 2) with the opening 20 (as shown in FIG. 3) has a frequency of operation of 5.18 GHz, noise included in signals may be resonated at approximately 10.31 GHz (a shift in the resonant frequency from 10.36 GHz to 10.31 GHz). Additionally, the coupling power is reduced from approximately −32 dB to approximately −35 dB at the frequency of approximately 10.36 GHz; therefore, when the semiconductor device package 1' (FIG. 1A) has a frequency of operation of 5.18 GHz, the coupling power at approximately 10.36 GHz is approximately −32 dB, whereas when the semiconductor device package 2 (FIG. 2) with the opening 20 (as shown in FIG. 3) has a frequency of operation of 5.18 GHz, the coupling power at approximately 10.36 GHz is approximately −35 dB.

Figure 3C:
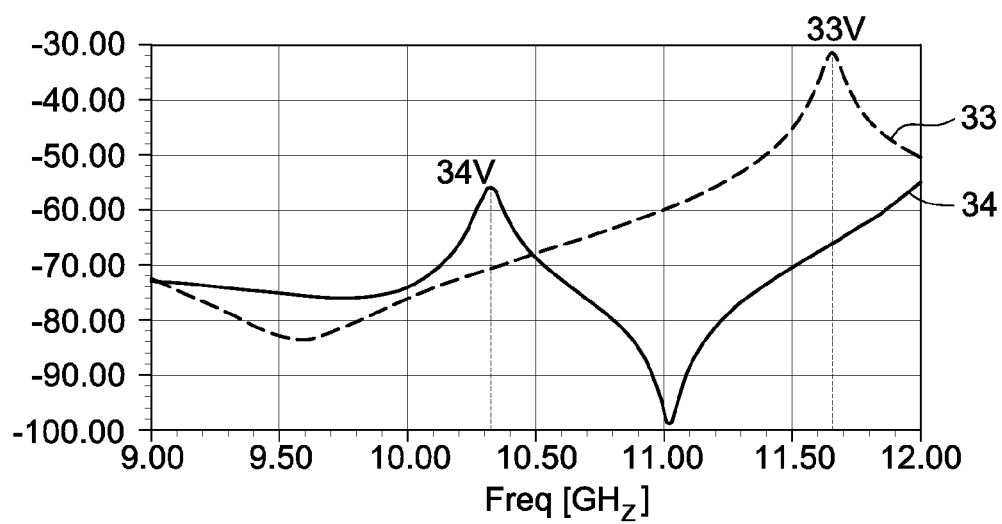
FIG. 3C plots frequency responses of different semiconductor device packages in accordance with embodiments of the present disclosure.

FIG. 3C plots frequency responses of different semiconductor device packages in accordance with embodiments of the present disclosure. A dotted line 33 represents a frequency response of the semiconductor device package 1' as shown in FIG. 1A, and a line 34 represents a frequency response of the semiconductor device package 2 having the EMI shield 19 as shown FIG. 3, where the opening 20 of the EMI shield 19 has a length $L_1$ of approximately 8.0 mm and a height $H_1$ of approximately 0.8 mm. The vertical axis of the plot in FIG. 3C represents coupling power of any two conductive lines/ports in a semiconductor device package, for example, coupling power of the input and the output of the power amplifier 131 in the semiconductor device package 2 of FIG. 2.

Referring to the dotted line 33, a peak 33V shows that the dotted line 33 has a relative maximum coupling power of approximately −32 dB at a frequency of approximately 11.65 GHz.

Referring to the line 34, a peak 34V shows that the line 34 has a relative maximum coupling power of approximately −55 dB at a frequency of approximately 10.31 GHz. The line 34 has a coupling power of approximately −68 dB at a frequency of approximately 11.65 GHz and a coupling power of approximately −58 dB at a frequency of approximately 10.36 GHz.

Comparing the peak 33V with the peak 34V, the resonant frequency is shifted from approximately 11.65 GHz to approximately 10.31 GHz due to a structural change from the EMI shield 19' (FIG. 1A) to the EMI shield 19 (FIG. 2) with the opening 20 of FIG. 3. When the semiconductor device package 1' (FIG. 1A) has a frequency of operation of 5.825 GHz, for example, noise included in signals may be resonated at approximately 11.65 GHz (twice the frequency of operation). When the semiconductor device package 2 (FIG. 2) with the opening 20 (as shown in FIG. 3) has a frequency of operation of 5.825 GHz, noise included in signals may be resonated at approximately 10.31 GHz (a shift in the resonant frequency from 11.65 GHz to 10.31 GHz).

Figure 4A:
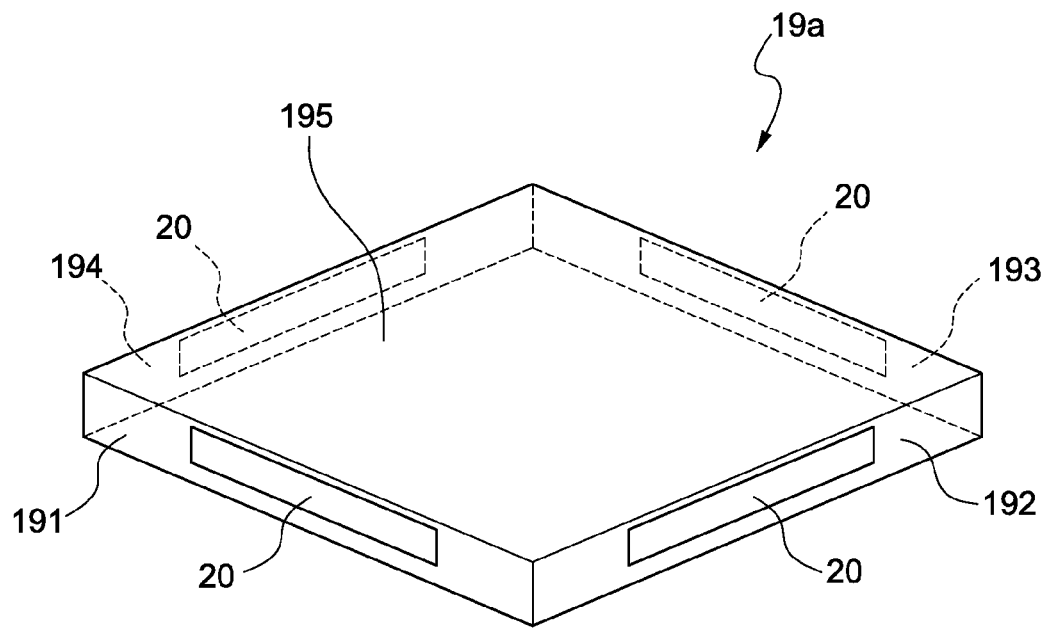
FIG. 4A illustrates an EMI shield in accordance with embodiments of the present disclosure.

FIG. 4A illustrates a perspective view of an EMI shield in accordance with one or more embodiments of the present disclosure. Referring to FIG. 4A, an EMI shield 19*a* is similar to the EMI shield 19 as illustrated and described with reference to FIG. 3, except that each of the side portions 192, 193 and 194 also includes an opening 20. Each opening 20 has a length $L_1$ of approximately 6 mm and a height $H_1$ of approximately 0.2 mm. The resonant frequency is shifted from approximately 10.58 GHz to approximately 9.08 GHz due to a structural change from the EMI shield 19' (FIG. 1A) to the EMI shield 19*a* with four openings 20 (FIG. 4A).

Figure 4B:
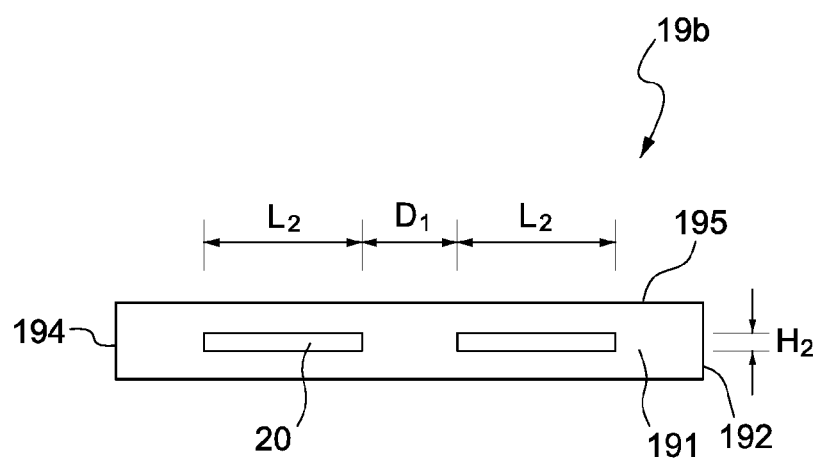
FIG. 4B, FIG. 4C, and FIG. 4D each illustrates an enlarged view of a portion of an EMI shield in accordance with embodiments of the present disclosure.

FIG. 4B illustrates an enlarged view of a portion of an EMI shield 19*b* in accordance with one or more embodiments of the present disclosure. The EMI shield 19*b* is similar to the EMI shield 19*a* as illustrated and described with reference to FIG. 4A, except that each of the side portions 191, 192, 193 and 194 includes two openings 20. Each opening 20 has a length $L_2$ of approximately 3 mm and a height $H_2$ of approximately 0.2 mm. Two adjacent openings 20 on one side (the side portion 191, 192, 193 or 194) are separated by a distance $D_1$ of approximately 0.5 mm to approximately 3 mm. The resonant frequency is shifted from approximately 10.58 GHz to approximately 10.18 GHz due to a structural change from the EMI shield 19' (FIG. 1A) to the EMI shield 19*b* (FIG. 4B).

Figure 4C:
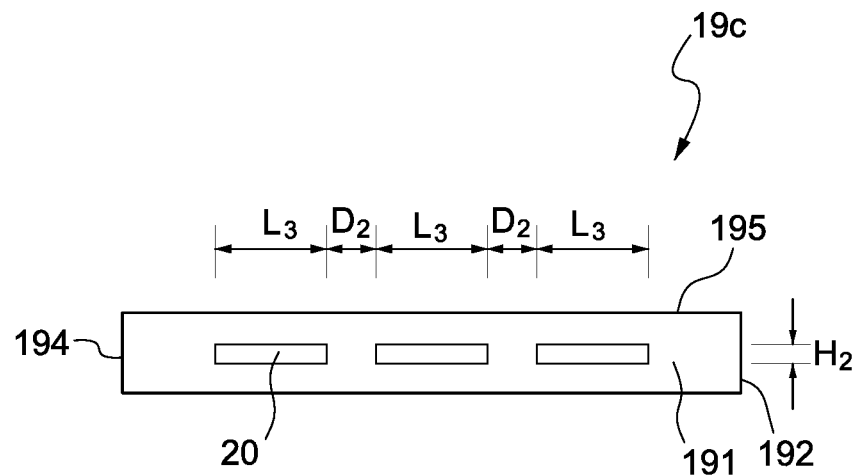

FIG. 4C illustrates an enlarged view of a portion of an EMI shield 19*c* in accordance with one or more embodiments of the present disclosure. The EMI shield 19*c* is similar to the EMI shield 19*a* as illustrated and described with reference to FIG. 4A, except that each of the side portions 191, 192, 193 and 194 includes three openings 20. Each opening 20 has a length $L_3$ of approximately 2 mm and a height $H_2$ of approximately 0.2 mm. Two adjacent openings 20 on one side (the side portion 191, 192, 193 or 194) are separated by a distance $D_2$ of approximately 0.5 mm to approximately 3 mm. The resonant frequency is shifted from approximately 10.58 GHz to approximately 10.46 GHz due to a structural change from the EMI shield 19' (FIG. 1A) to the EMI shield 19*c* (FIG. 4C).

Figure 4D:
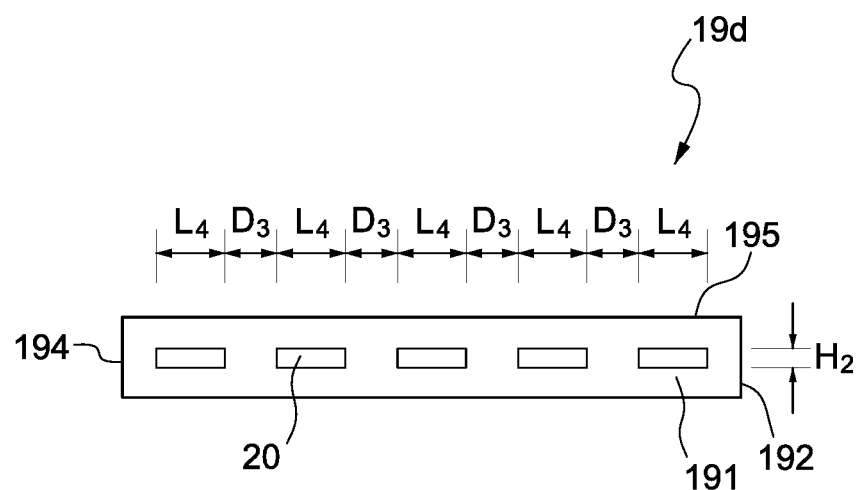

FIG. 4D illustrates an enlarged view of a portion of an EMI shield 19*d* in accordance with one or more embodiments of the present disclosure. The EMI shield 19*d* is similar to the EMI shield 19*a* as illustrated and described with reference to FIG. 4A, except that each of the side portions 191, 192, 193 and 194 includes five openings 20. Each opening 20 has a length $L_4$ of approximately 1.2 mm and a height $H_2$ of approximately 0.2 mm. Two adjacent openings 20 on one side (the side portion 191, 192, 193 or 194) are separated by a distance $D_3$ of approximately 0.5 mm to approximately 2 mm. The resonant frequency is shifted from approximately 10.58 GHz to approximately 10.56 GHz due to a structural change from the EMI shield 19' (FIG. 1A) to the EMI shield 19*d* (FIG. 4D).

Referring back to FIG. 4B, a sum $L_s$ of the lengths $L_2$ for a frequency of operation from approximately 5.180 GHz to approximately 5.825 GHz is determined by $0.026\lambda \leq L_s \leq 0.155\lambda$, where $\lambda$ is a wavelength of the frequency of operation of the semiconductor device package 2 with openings 20 as shown in FIG. 4B.

Referring back to FIG. 4C, a sum $L_s$ of the lengths $L_3$ for a frequency of operation from approximately 5.180 GHz to approximately 5.825 GHz is determined by $0.026\lambda \leq L_s \leq 0.155\lambda$, where $\lambda$ is a wavelength of the frequency of operation of the semiconductor device package 2 with openings 20 as shown in FIG. 4C.

Referring back to FIG. 4D, a sum $L_s$ of the lengths $L_4$ for a frequency of operation from approximately 5.180 GHz to approximately 5.825 GHz is determined by $0.026\lambda \leq L_s \leq 0.155\lambda$, where $\lambda$ is a wavelength of the frequency of operation of the semiconductor device package 2 with openings 20 as shown in FIG. 4D.

Figure 5:
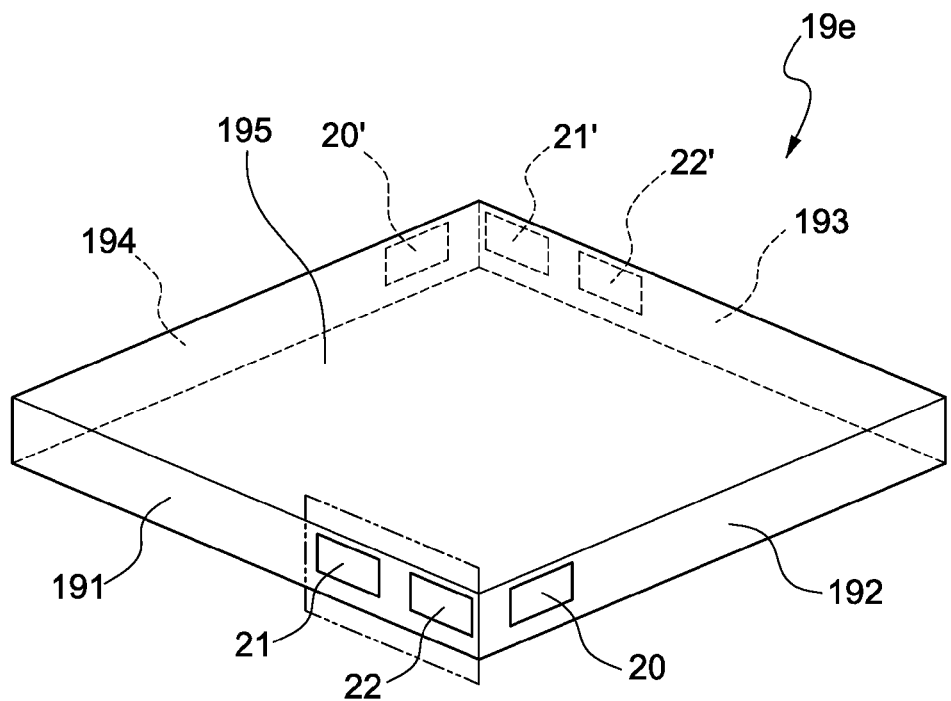
FIG. 5 illustrates an EMI shield in accordance with embodiments of the present disclosure.

FIG. 5 illustrates an EMI shield 19e in accordance with one or more embodiments of the present disclosure. The EMI shield 19e has a top portion 195, a side portion 191, a side portion 192, a side portion 193 and a side portion 194. The EMI shield 19e is similar to the EMI shield 19' as illustrated and described with reference to FIG. 1A, except that the side portion 191 has openings 21 and 22, the side portion 192 has an opening 20, the side portion 193 has openings 21' and 22' and the side portion 194 has an opening 20'.

The opening 21 is adjacent to the opening 22. The opening 21 and the opening 22 are at substantively a same elevation. The openings 20 and 22 are close to where the side portion 191 and the side portion 192 join. Similarly, the opening 21' is adjacent to the opening 22', the opening 21' and the opening 22' are at substantively a same elevation, and the openings 20' and 21' are close to where the side portion 193 and the side portion 194 join.

The openings 20 and 20' are substantially and diagonally symmetric. The openings 22 and 21' are substantially and diagonally symmetric. The openings 21 and 22' are substantially and diagonally symmetric. Other arrangements or positions of the openings 20, 21, 22, 20', 21' and 22' are also within the scope of the present disclosure.

In one or more embodiments, the openings 20, 21, 22, 20', 21' and 22' each have a substantially same size and shape as the others; in other embodiments, one or more of the openings 20, 21, 22, 20', 21' and 22' may have a different size or shape than the others.

In one or more embodiments, one of the openings 20, 21, 22, 20', 21' and 22' is formed on the EMI shield 19e and the remaining ones are omitted.

It is contemplated that one or more openings may be formed on the top portion 195 of the EMI shield 19e in FIG. 5, and may be disposed over one of more components of a corresponding semiconductor device package (e.g., components such as the IC 11, the RF module 121, the power amplifier 131 and electronic component 17 on the top surface 101 of the substrate 10 in FIG. 2).

Figure 5A:
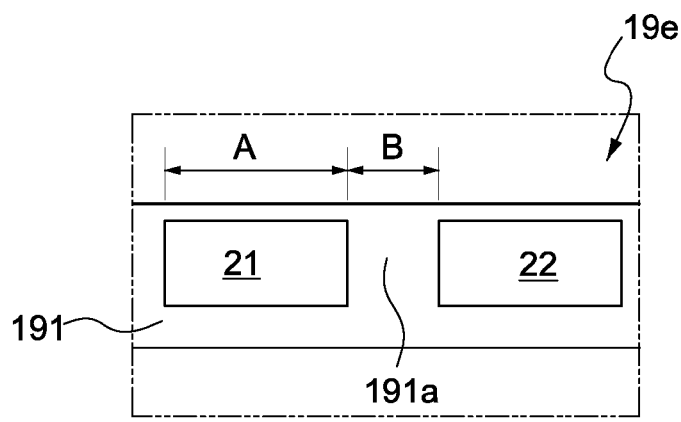
FIG. 5A illustrates an enlarged view of a portion of the EMI shield of FIG. 5 in accordance with embodiments of the present disclosure.

FIG. 5A illustrates an enlarged view of a portion of the EMI shield 19e shown in dotted outline in FIG. 5, in accordance with one or more embodiments of the present disclosure. The openings 21 and 22 are separated by a wall portion 191a of the side portion 191. The opening 21 has a length A and the wall portion 191a has a length B. The length A is greater than or equal to the length B. A ratio of the length A to the length B may range from approximately one to approximately ten; for example, the length A may be 1 mm and the length B may be 1 mm.

Figure 5B:
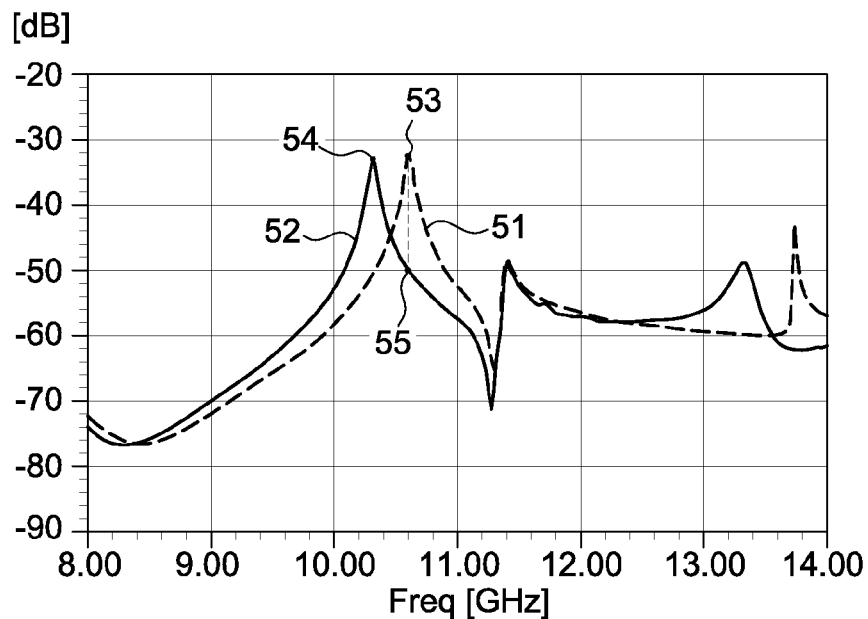
FIG. 5B plots frequency responses of different semiconductor device packages in accordance with embodiments of the present disclosure.

FIG. 5B plots frequency responses of different semiconductor device packages in accordance with embodiments of the present disclosure. A dotted line 51 represents a frequency response of the semiconductor device package 1' as shown in FIG. 1A, and a line 52 represents a frequency response of the semiconductor device package 2 as shown in FIG. 2, where the EMI shield 19 in FIG. 2 is replaced by the EMI shield 19e as shown in FIG. 5. A vertical axis of the plot in FIG. 5B represents coupling power of any two conductive lines/ports in a semiconductor device package, for example, coupling power of the input and the output of the power amplifier 131 in FIG. 2.

Referring to the dotted line 51, a peak 53 shows that the dotted line 51 has a relative maximum coupling power of approximately −32 dB at a frequency of approximately 10.58 GHz.

Referring to the line 52, a peak 54 shows that the line 52 has a relative maximum coupling power of approximately −32 dB at a frequency of approximately 10.22 GHz. The point 55 of the line 52 has a coupling power of approximately −50 dB at a frequency of approximately 10.58 GHz.

Comparing point 54 with point 53, the resonant frequency is shifted from approximately 10.58 GHz to approximately 10.22 GHz due to a structural change from the EMI shield 19' (FIG. 1A) to the EMI shield 19e (FIG. 5). When the semiconductor device package 1' has a frequency of operation in the 5 GHz band, noise included in signals may be resonated at approximately 10.58 GHz, which falls within a frequency band that is double the 5 GHz frequency band (e.g., double the frequency band 5.18 GHz to 5.825 GHz is the frequency band 10.36 GHz to 11.65 GHz). When the semiconductor device package 2 has a frequency of operation in the 5 GHz band, noise included in signals may be resonated at approximately 10.22 GHz, which is outside the frequency band that is double the 5 GHz frequency band (10.36 GHz to 11.65 GHz).

Comparing point 55 with point 53, the coupling power is reduced from approximately −32 dB to approximately −50 dB at approximately 10.58 GHz. When the semiconductor device package 1' (FIG. 1A) has a frequency of operation in the 5 GHz frequency band, the coupling power at approximately 10.58 GHz is approximately −32 dB. When the semiconductor device package 2 (FIG. 2) with the EMI shield 19e (FIG. 5) has a frequency of operation in the 5 GHz frequency band, the coupling power at approximately 10.58 GHz is approximately −50 dB.

Figure 6:
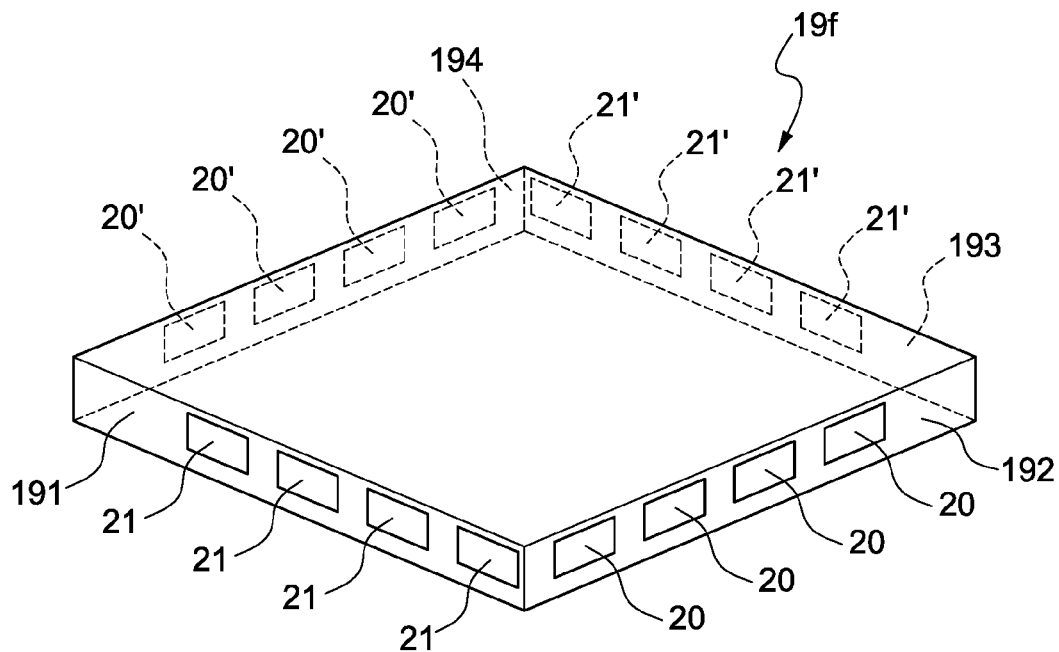
FIG. 6 illustrates an EMI shield in accordance with embodiments of the present disclosure.

FIG. 6 illustrates an EMI shield 19f in accordance with one or more embodiments of the present disclosure. Openings 20, 20', 21, 21' are formed on the side portions 191, 192, 193 and 194 and there are no openings adjacent to a joint between the side portions 191 and 194 or adjacent to a joint between the side portions 192 and 193. Openings 20 and 21 are close to a joint between the side portions 191 and 192, and openings 20' and 21' are close to a joint between the side portions 193 and 194.

Figure 6A:
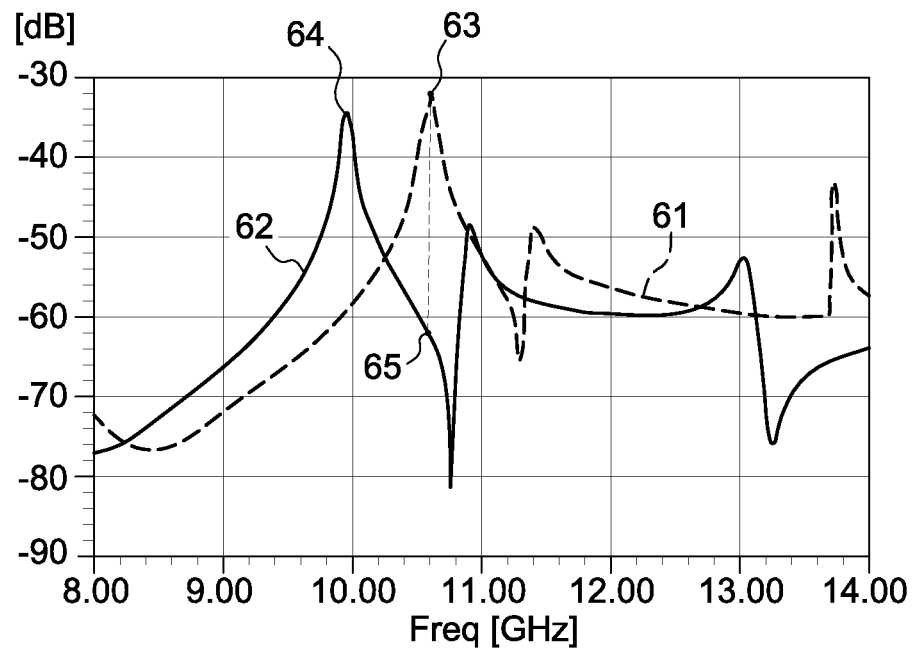
FIG. 6A plots frequency responses of different semiconductor device packages in accordance with embodiments of the present disclosure.

FIG. 6A plots frequency responses of different semiconductor device packages in accordance with embodiments of the present disclosure. A dotted line 61 represents a frequency response of the semiconductor device package 1' as shown in FIG. 1A, and a line 62 represents a frequency response of the semiconductor device package 2 as shown in FIG. 2 with the EMI shield 19 replaced by the EMI shield 19f in FIG. 6. A vertical axis of FIG. 6A represents coupling power of any two conductive lines/ports in a semiconductor device package, for example, coupling power of the input and the output of the power amplifier 131 in FIG. 2.

Referring to the dotted line 61, a peak 63 shows that the dotted line 61 has a relative maximum coupling power of approximately −32 dB at a frequency of approximately 10.58 GHz.

Referring to the line 62, a peak 64 shows that the line 62 has a relative maximum coupling power of approximately −35 dB at a frequency of approximately 9.85 GHz. The point 65 of the line 62 has a coupling power of approximately −62 dB at a frequency of approximately 10.58 GHz.

Comparing point 64 with point 63, the resonant frequency is shifted from approximately 10.58 GHz to approximately 9.85 GHz due to a structural change from the EMI shield 19' (FIG. 1A) to the EMI shield 19f (FIG. 6). When the semiconductor device package 1' (FIG. 1A) has a frequency of operation in the 5 GHz frequency band, noise included in signals may be resonated at approximately 10.58 GHz, which falls within a frequency band that is double the 5 GHz frequency band (e.g., double the frequency band 5.18 GHz to 5.825 GHz is the frequency band 10.36 GHz to 11.65 GHz). When the semiconductor device package 2 (FIG. 2) with the EMI shield 19f (FIG. 6) has a frequency of operation in the 5 GHz band, noise included in signals may be resonated at approximately 9.85 GHz, which is outside the frequency band that is double the 5 GHz frequency band (10.36 GHz to 11.65 GHz).

Comparing point 65 with point 63, the coupling power is reduced from approximately −32 dB to approximately −62 dB at the frequency of approximately 10.58 GHz. When the semiconductor device package 1' (FIG. 1A) has a frequency of operation in the 5 GHz frequency band, the coupling power at approximately 10.58 GHz is approximately −32 dB. When the semiconductor device package 2 (FIG. 2) with the EMI shield 19f (FIG. 6) has a frequency of operation in the 5 GHz frequency band, the coupling power at approximately 10.58 GHz is approximately −62 dB.

Figure 6B:
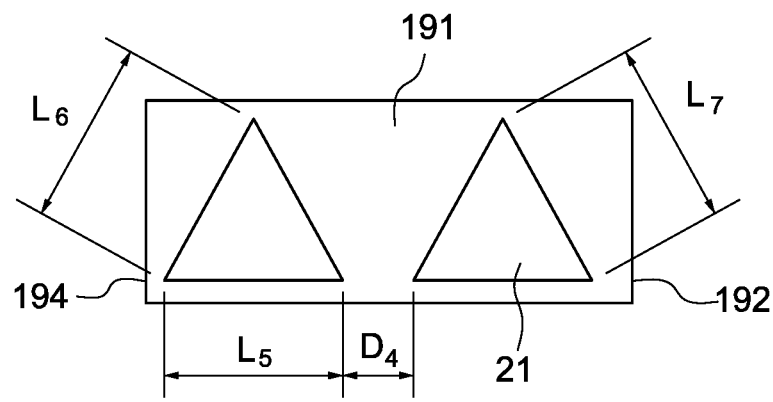
FIG. 6B, FIG. 6C, FIG. 6D, FIG. 6E, FIG. 6F, FIG. 6G, FIG. 6H, FIG. 6I, FIG. 6J, FIG. 6K, FIG. 6L, FIG. 6M, FIG. 6N, FIG. 6O, FIG. 6P, FIG. 6Q and FIG. 6R each illustrates an enlarged view of a portion of an EMI shield in accordance with embodiments of the present disclosure.

Openings in an EMI shield may have shapes other than rectangular, as illustrated by examples in the following FIGS. 6B-6R. Each of the FIGS. 6B-6R illustrates an enlarged view of a portion of an EMI shield in accordance with one or more embodiments of the present disclosure, where representative openings are referred to as openings 21. It is to be understood that other shapes, sizes and combinations of openings are also within the scope of the present disclosure.

FIG. 6B illustrates triangular openings 21. In one or more embodiments, the openings 21 are shaped as equilateral triangles, with a length $L_5$ of approximately 1.21 mm, a length $L_6$ of approximately 1.21 mm and a length $L_7$ of approximately 1.21 mm. The openings 21 are disposed at substantially a same elevation with respect to an upper or lower surface of the EMI shield (in the orientation shown). Two adjacent openings 21 are separated by a distance $D_4$ of approximately 0.3 mm. With this design, the resonant frequency is shifted from approximately 10.58 GHz (FIG. 1A) to approximately 10.49 GHz (FIG. 6B).

Figure 6C:
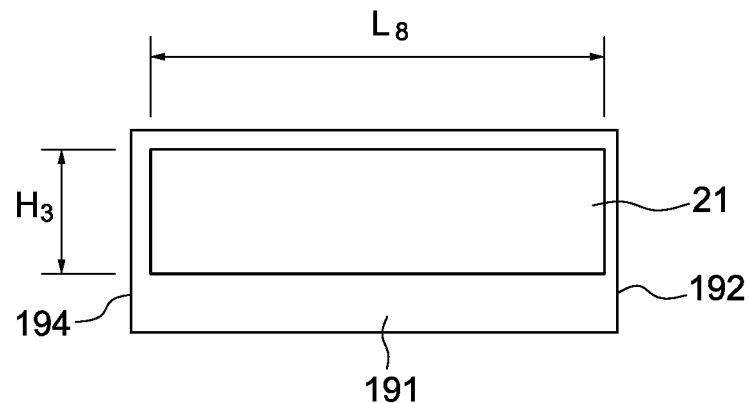

FIG. 6C illustrates an enlarged view of a portion of the EMI shield of FIG. 6 in accordance with one or more embodiments of the present disclosure. Each of the rectangular openings 20, 20', 21, 21' in FIG. 6 may be changed to have dimensions similar to the opening 21 in FIG. 6C, where a length $L_8$ is approximately 3 mm and a height $H_3$ is approximately 0.8 mm. With this design, the resonant frequency is shifted from approximately 10.58 GHz (FIG. 1A) to approximately 9.56 GHz (FIG. 6C)

Figure 6D:
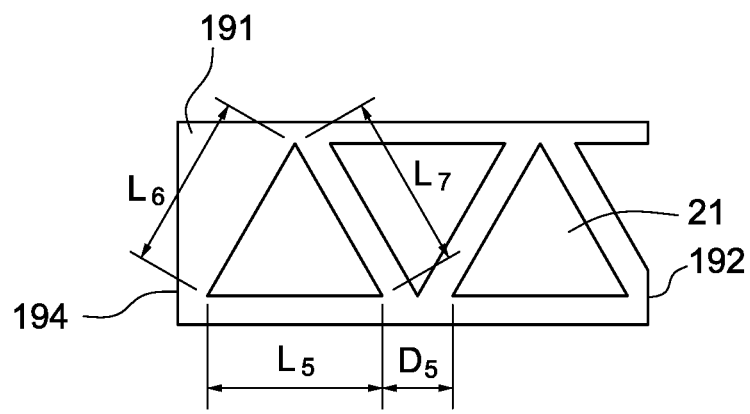

FIG. 6D illustrates triangular openings 21. In one or more embodiments, the openings 21 are shaped as equilateral triangles, with a length $L_5$ of approximately 1.21 mm, a length $L_6$ of approximately 1.21 mm and a length $L_7$ of approximately 1.21 mm. The openings 21 are disposed at substantially a same elevation with respect to an upper or lower surface of the EMI shield (in the orientation shown). The leftmost opening 21 and the rightmost opening 21 are separated by a distance $D_5$ of approximately 0.48 mm. The openings 21 are arranged such that the triangular shapes alternate in orientation, with every triangular shape inverted from its neighbor triangular shapes. With this design, the resonant frequency is shifted from approximately 10.58 GHz (FIG. 1A) to approximately 10.36 GHz (FIG. 6D).

Figure 6E:
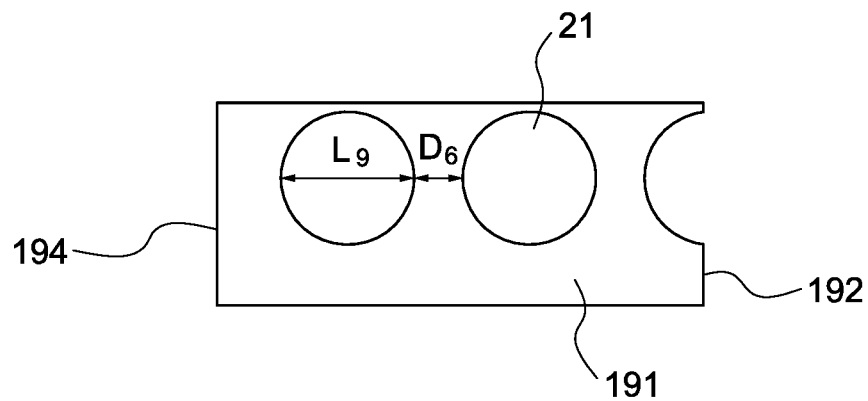

FIG. 6E illustrates circular openings 21. Each opening 21 has a diameter $L_9$ of approximately 0.9 mm. The openings 21 are disposed at substantially a same elevation. Two adjacent openings 21 are separated by a distance $D_6$ of approximately 0.3 mm. With this design, the resonant frequency is shifted from approximately 10.58 GHz (FIG. 1A) to approximately 10.52 GHz (FIG. 6E).

Figure 6F:
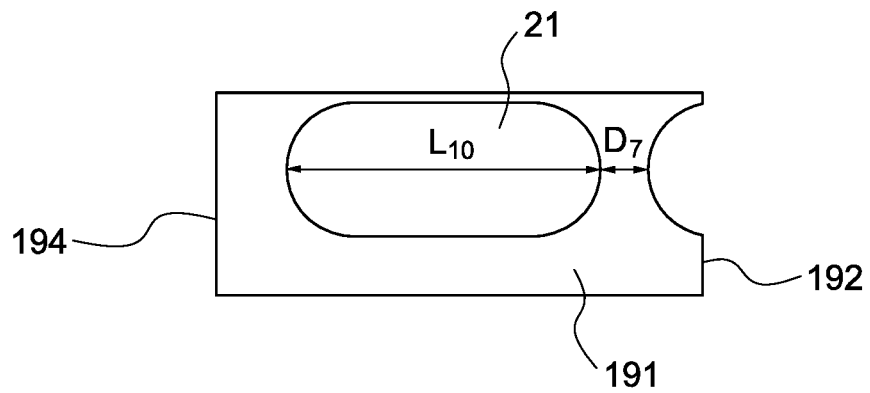

FIG. 6F illustrates elliptical openings 21 with a longest diameter or major axis $L_{10}$ of approximately 2.1 mm. The openings 21 are disposed at substantially a same elevation. Two adjacent openings 21 are separated by a distance $D_7$ of approximately 0.3 mm. With this design, the resonant frequency is shifted from approximately 10.58 GHz (FIG. 1A) to approximately 10.02 GHz (FIG. 6F).

Figure 6G:
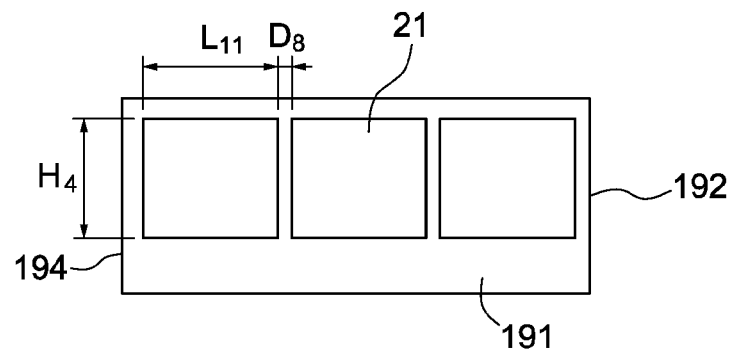

FIG. 6G illustrates approximately square openings 21 with a length $L_{11}$ of approximately 0.95 mm and a height $H_4$ of approximately 0.8 mm. Two adjacent openings 21 are separated by a distance $D_8$ of approximately 0.1 mm. With this design, the resonant frequency is shifted from approximately 10.58 GHz (FIG. 1A) to approximately 10.40 GHz (FIG. 6G).

Figure 6H:
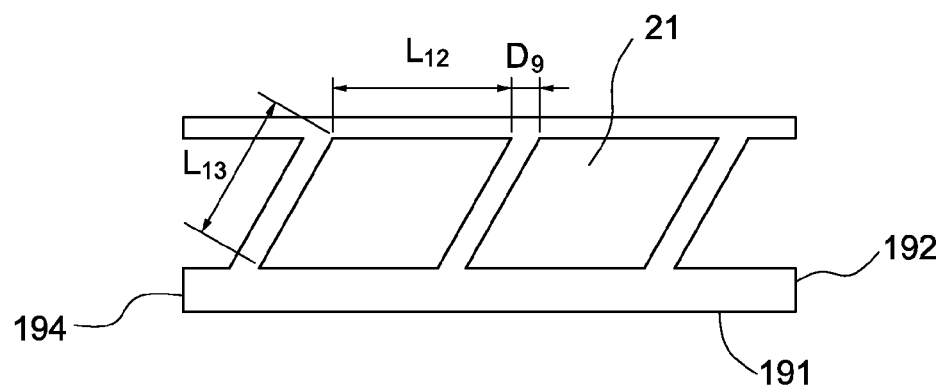

FIG. 6H illustrates parallelogram openings 21 with a length $L_{12}$ of approximately 1.45 mm and a length $L_{13}$ of approximately 1.2 mm. The openings 21 are disposed at substantially a same elevation. Two adjacent openings 21 are separated by a distance $D_9$ of approximately 0.25 mm. With this design, the resonant frequency is shifted from approximately 10.58 GHz (FIG. 1A) to approximately 9.97 GHz (FIG. 6H).

Figure 6I:
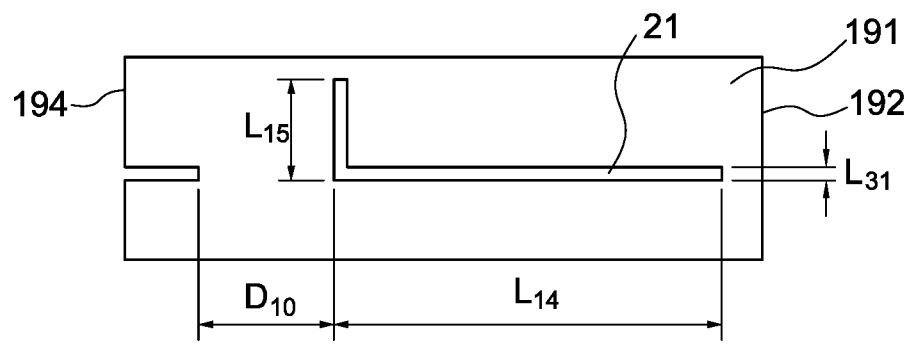

FIG. 6I illustrates L-shaped openings 21 with a length $L_{14}$ of approximately 3 mm, a length $L_{15}$ of approximately 0.8 mm and a width $L_{31}$ of approximately 0.1 mm. The openings 21 are disposed at substantially a same elevation. Two adjacent openings 21 are separated by a distance $D_{10}$ of approximately 1 mm. With this design, the resonant frequency is shifted from approximately 10.58 GHz (FIG. 1A) to approximately 9.98 GHz (FIG. 6I).

Figure 6J:
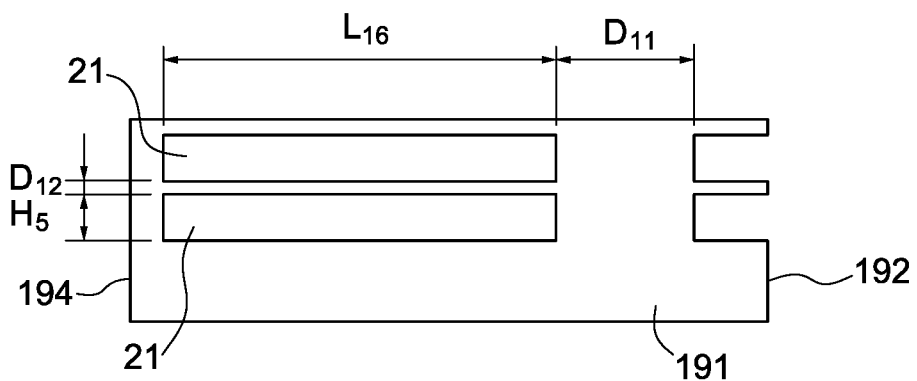

FIG. 6J illustrates pairs of openings 21 with a length $L_{16}$ of approximately 3 mm and a height $H_5$ of approximately 0.35 mm. The openings 21 are laterally separated by a distance $D_{11}$ of approximately 1 mm and vertically separated by a distance $D_{12}$ of approximately 0.1 mm. With this design, the resonant frequency is shifted from approximately 10.58 GHz (FIG. 1A) to approximately 9.62 GHz (FIG. 6J).

Figure 6K:
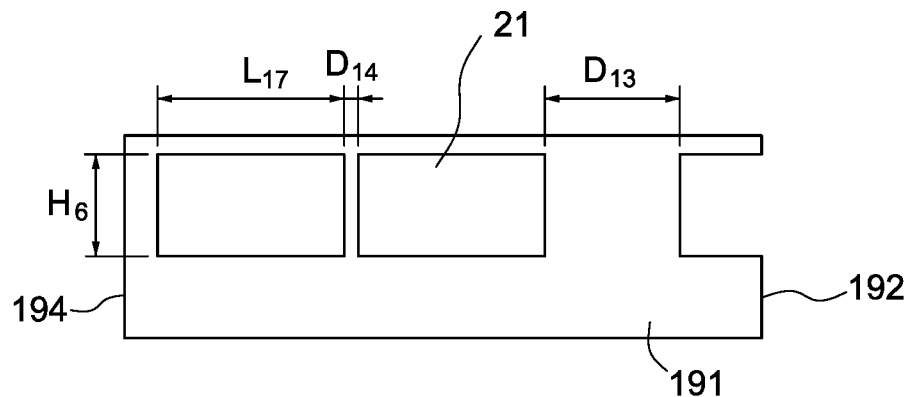

FIG. 6K illustrates pairs of rectangular openings 21, each opening 21 with a length $L_{17}$ of approximately 1.45 mm and a height $H_6$ of approximately 0.8 mm. Each pair of openings 21 is separated from a neighboring pair of openings 21 by a distance $D_{13}$ of approximately 1 mm. Each opening 21 is separated from the other opening 21 in the same pair by a distance $D_{14}$ of approximately 0.1 mm. With this design, the resonant frequency is shifted from approximately 10.58 GHz (FIG. 1A) to approximately 10.2 GHz (FIG. 6K).

Figure 6L:
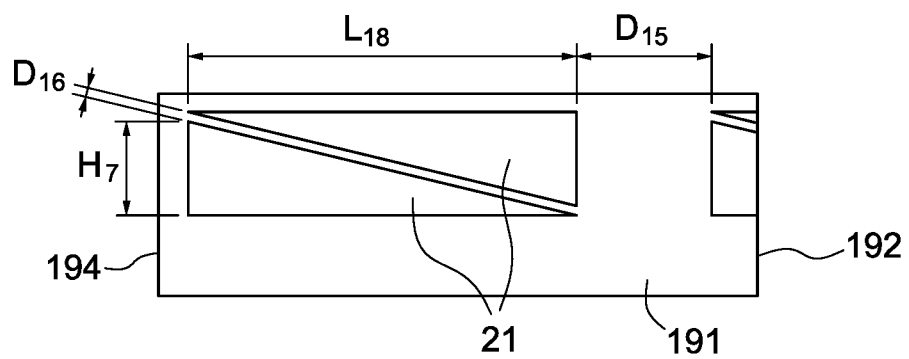

FIG. 6L illustrates pairs of triangular openings 21, each opening 21 with a length $L_{18}$ of approximately 3 mm and a height $H_7$ of approximately 0.8 mm. Each pair of openings 21 is separated from a neighboring pair of openings 21 by a distance $D_{15}$ of approximately 1 mm. Each opening 21 is separated from the other opening 21 in the same pair by a distance $D_{16}$ of approximately 0.065 mm. With this design, the resonant frequency is shifted from approximately 10.58 GHz (FIG. 1A) to approximately 9.77 GHz (FIG. 6L).

Figure 6M:
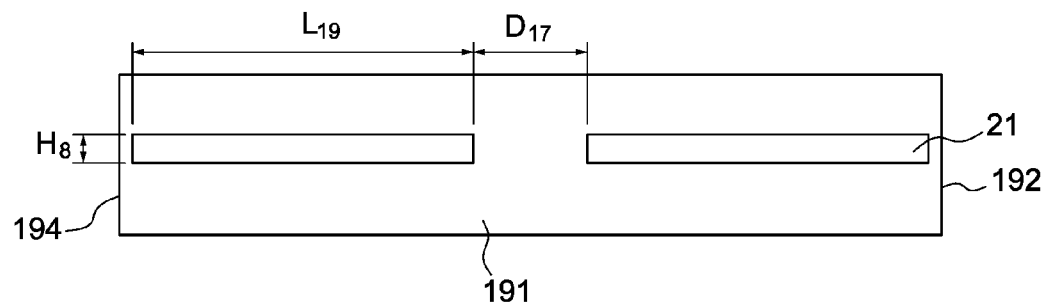

FIG. 6M illustrates narrow rectangular openings 21 with a length $L_{19}$ of approximately 3 mm and a height $H_8$ of approximately 0.25 mm. Two adjacent openings 21 are separated by a distance $D_{17}$ of approximately 1 mm. With this design, the resonant frequency is shifted from approximately 10.58 GHz (FIG. 1A) to approximately 9.96 GHz (FIG. 6M).

Figure 6N:
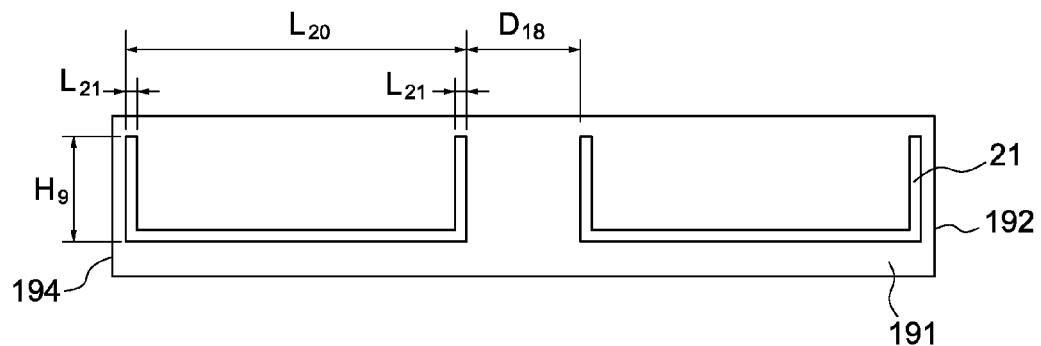

FIG. 6N illustrates U-shaped openings 21 with a length $L_{20}$ of approximately 3 mm, a width $L_{21}$ of approximately 0.1 mm and a height $H_9$ of approximately 0.8 mm. Two adjacent openings 21 are separated by a distance $D_{18}$ of approximately 1 mm. With this design, the resonant frequency is shifted from approximately 10.58 GHz (FIG. 1A) to approximately 9.74 GHz (FIG. 6N).

Figure 6O:
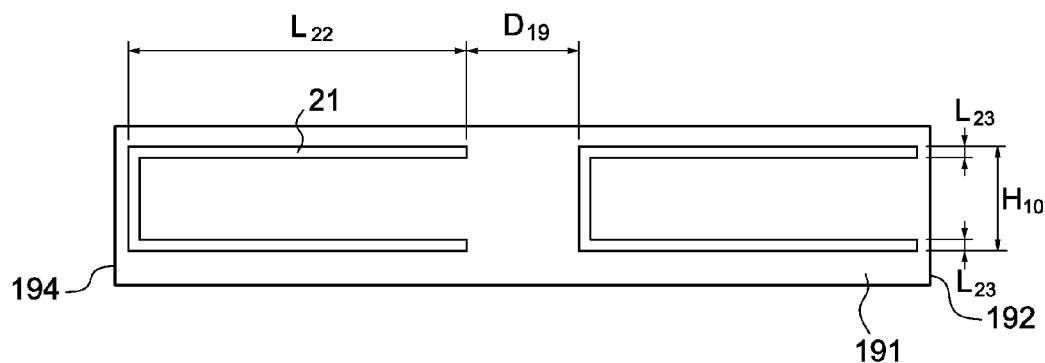

FIG. 6O illustrates C-shaped openings 21 with a length $L_{22}$ of approximately 3 mm, a width $L_{23}$ of approximately 0.1 mm and a height $H_{10}$ of approximately 0.8 mm. Two adjacent openings 21 are separated by a distance $D_{19}$ of approximately 1 mm. With this design, the resonant frequency is shifted from approximately 10.58 GHz (FIG. 1A) to approximately 9.86 GHz (FIG. 6O).

Figure 6P:
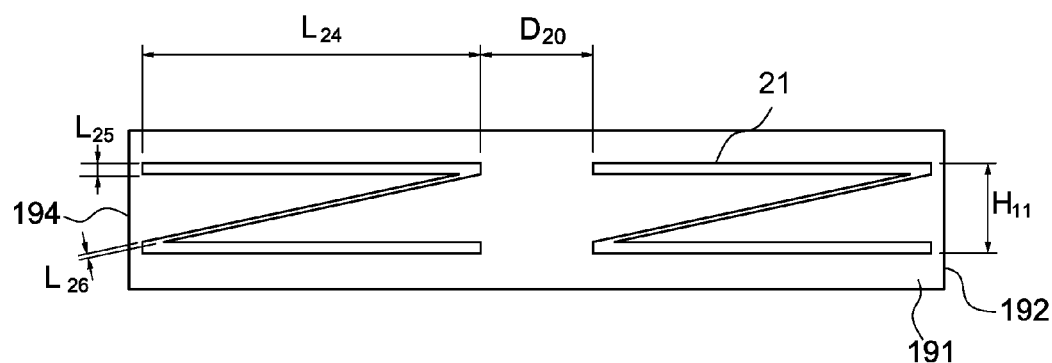

FIG. 6P illustrates Z-shaped openings 21 with a length $L_{24}$ of approximately 3 mm, a width $L_{25}$ of approximately 0.1 mm, a height $H_{11}$ of approximately 0.8 mm, and a width $L_{26}$ of approximately 0.04 mm. Two adjacent openings 21 are separated by a distance $D_{20}$ of approximately 1 mm. With this design, the resonant frequency is shifted from approximately 10.58 GHz (FIG. 1A) to approximately 9.82 GHz (FIG. 6P).

Figure 6Q:
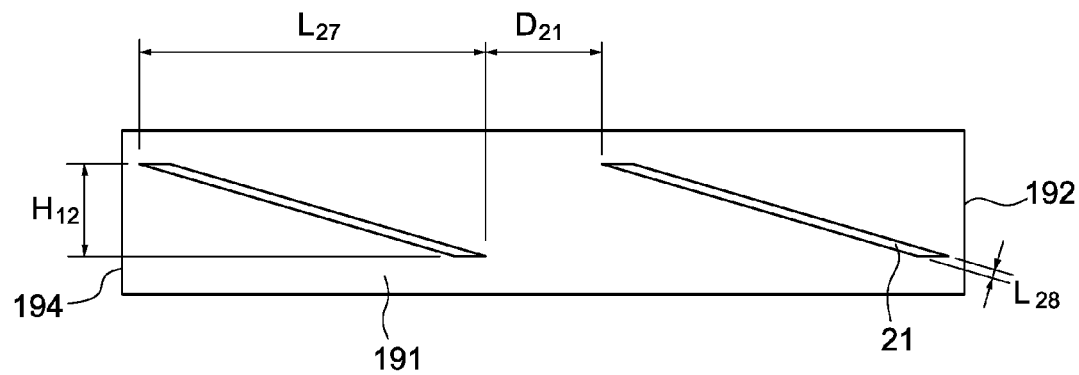
Figure 6R:
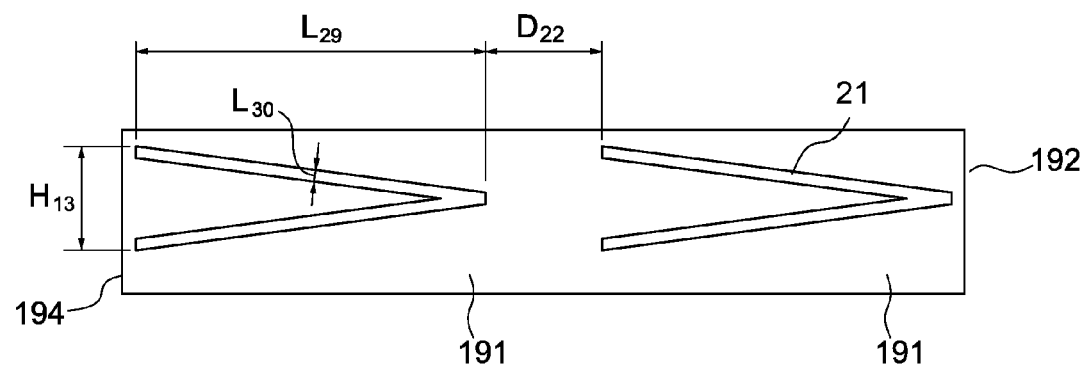

FIG. 6Q illustrates diagonal openings 21 with a length $L_{27}$ of approximately 3 mm, a height $H_{12}$ of approximately 0.8 mm, and a width $L_{28}$ of approximately 0.075 mm. Two adjacent openings 21 are separated by a distance $D_{21}$ of approximately 1 mm. With this design, the resonant frequency is shifted from approximately 10.58 GHz (FIG. 1A) to approximately 10.38 GHz (FIG. 6Q).

FIG. 6R illustrates rotated V-shaped openings 21 with a length $L_{29}$ of approximately 3 mm, a height $H_{13}$ of approximately 0.8 mm, and a width $L_{30}$ of approximately 0.1 mm. Two adjacent openings 21 are separated by a distance $D_{22}$ of approximately 1 mm. With this design, the resonant frequency is shifted from approximately 10.58 GHz (FIG. 1A) to approximately 10.04 GHz (FIG. 6R).

Figure 7:
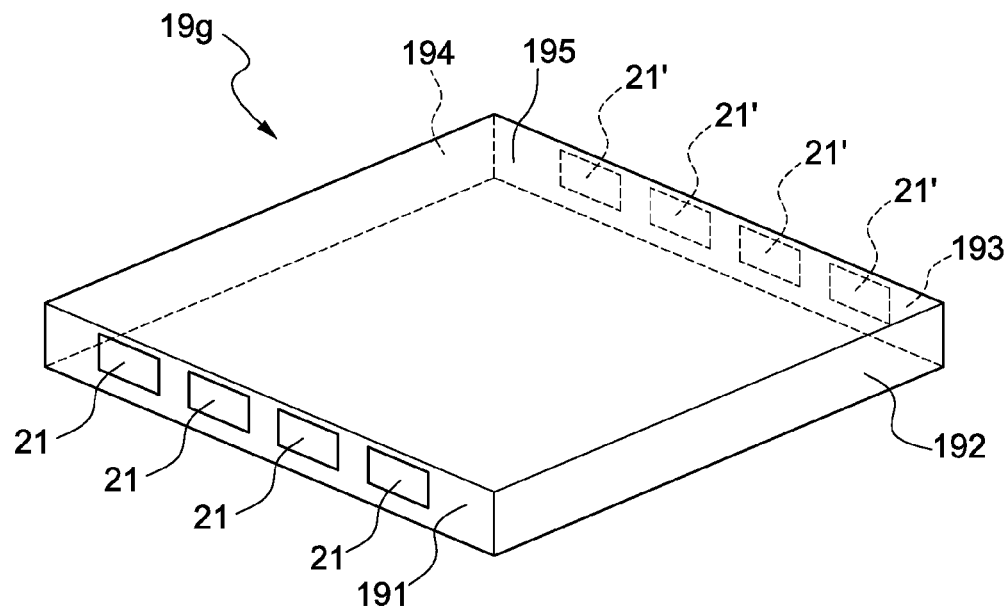
FIG. 7 illustrates an EMI shield in accordance with embodiments of the present disclosure.

FIG. 7 illustrates an EMI shield 19g in accordance with embodiments of the present disclosure. The EMI shield 19g is similar to the EMI shield 19f as illustrated and described with reference to FIG. 6, except that openings 20 and 20' are eliminated.

Figure 7A:
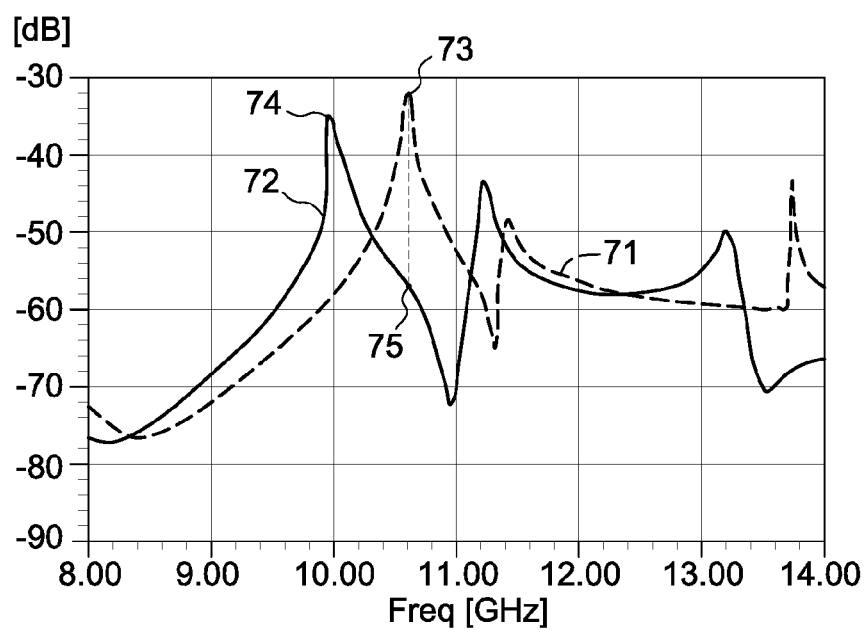
FIG. 7A plots frequency responses of different semiconductor device packages in accordance with embodiments of the present disclosure.

FIG. 7A plots frequency responses of different semiconductor device packages in accordance with embodiments of the present disclosure. A dotted line 71 represents a frequency response of the semiconductor device package 1' as shown in FIG. 1A, and a line 72 represents a frequency response of the semiconductor device package 2 as shown in FIG. 2 with the EMI shield 19 replaced by the EMI shield 19g of FIG. 7. A vertical axis of the plot in FIG. 7A represents coupling power of any two conductive lines/ports in a semiconductor device package, for example, coupling power of the input and the output of the power amplifier 131 as shown in FIG. 2.

Referring to the dotted line 71, a peak 73 shows that the dotted line 71 has a relative maximum coupling power of approximately −32 dB at a frequency of approximately 10.58 GHz.

Referring to the line 72, a peak 74 shows that the line 72 has a relative maximum coupling power of approximately −35 dB at a frequency of approximately 9.95 GHz. The point 75 of the line 72 has a coupling power of approximately −57 dB at a frequency of approximately 10.58 GHz.

Comparing point 74 with point 73, the resonant frequency is shifted from approximately 10.58 GHz to approximately 9.95 GHz due to a structural change from the EMI shield 19' (FIG. 1A) to the EMI shield 19g (FIG. 7). When the semiconductor device package 1' (FIG. 1A) has a frequency of operation in the 5 GHz frequency band, noise included in signals may be resonated at approximately 10.58 GHz, which is in a frequency band that is a double of the 5 GHz frequency band (approximately 10.36 GHz to approximately 11.65 GHz). When the semiconductor device package 2 (FIG. 2) with the EMI shield 19g (FIG. 7) has a frequency of operation in the 5 GHz frequency band, noise included in signals may be resonated at approximately 9.95 GHz, which is outside of the frequency band that is double the 5 GHz frequency band.

Comparing point 75 with point 73, the coupling power is reduced from approximately −32 dB to approximately −57 dB at approximately 10.58 GHz. When the semiconductor device package 1' (FIG. 1A) has a frequency of operation in the 5 GHz frequency band, the coupling power at approximately 10.58 GHz is approximately −32 dB. When the semiconductor device package 2 (FIG. 2) with the EMI shield 19g (FIG. 7) has a frequency of operation in the 5 GHz frequency band, the coupling power at approximately 10.58 GHz is approximately −57 dB.

Figure 8:
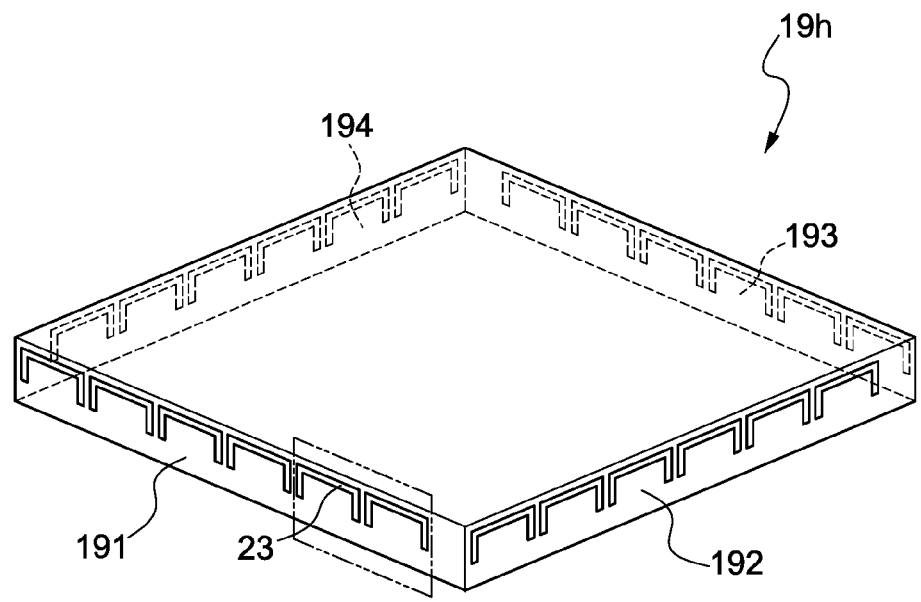
FIG. 8 illustrates an EMI shield in accordance with embodiments of the present disclosure.

FIG. 8 illustrates an EMI shield 19h in accordance with one or more embodiments of the present disclosure. The EMI shield 19h includes openings 23 on the side portions 191, 192, 193 and 194.

Figure 8A:
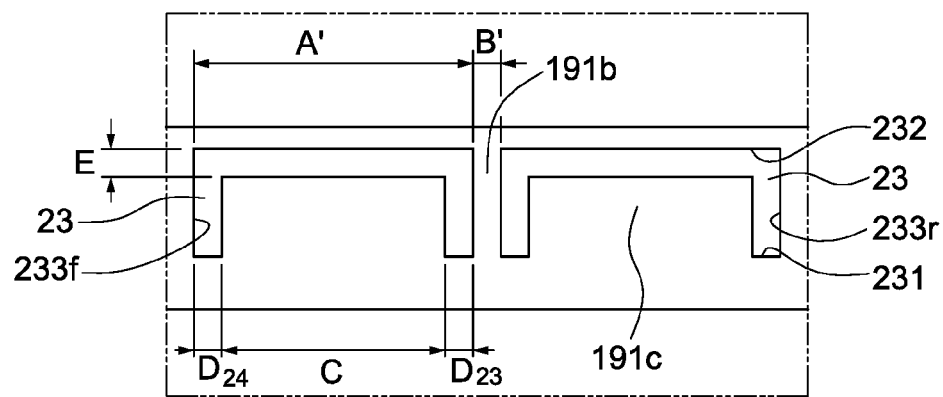
FIG. 8A illustrates an enlarged view of a portion of an EMI shield in accordance with embodiments of the present disclosure.

FIG. 8A illustrates an enlarged view of a portion of the EMI shield 19h shown in dotted line in FIG. 8. Two adjacent openings 23 are separated by a first wall portion 191b of the side portion 191. The openings 23 surround a second wall portion 191c of the side portion 191 on three sides. The opening 23 have a length A' and the first wall portion 191b has a length B'. The length A' is greater than the length B'. A ratio of the length A' to the length B' may range from approximately two to ten; for example, the length A' may be approximately 2 mm and the length B' may be approximately 0.2 mm.

The second wall portion 191c and a right edge 233r of the opening 23 are separated by a distance $D_{23}$. The second wall portion 191c and a left edge 233f of the opening 23 are separated by a distance $D_{24}$. The second wall portion 191c and an upper edge 232 of the opening 23 are separated by a distance E.

In one or more embodiments, a length C of the second wall portion 191c is approximately 1.6 mm; in other embodiments, the length C may have a different value. In one or more embodiments, the distance $D_{23}$ is approximately 0.2 mm; in other embodiments, the distance $D_{23}$ may have a different value. In one or more embodiments, the distance $D_{24}$ is approximately 0.2 mm; in other embodiments, the distance $D_{24}$ may have a different value. In one or more embodiments, the distance E is approximately 0.2 mm; in other embodiments, the distance E may have a different value.

It is contemplated that the openings 23 may be rotated, such that the second wall portion 191c may extend from one of the edges 232, 233r or 233f.

The relatively thin first wall portion 191b that separates openings 23 may function as an inductor structure.

Figure 8B:
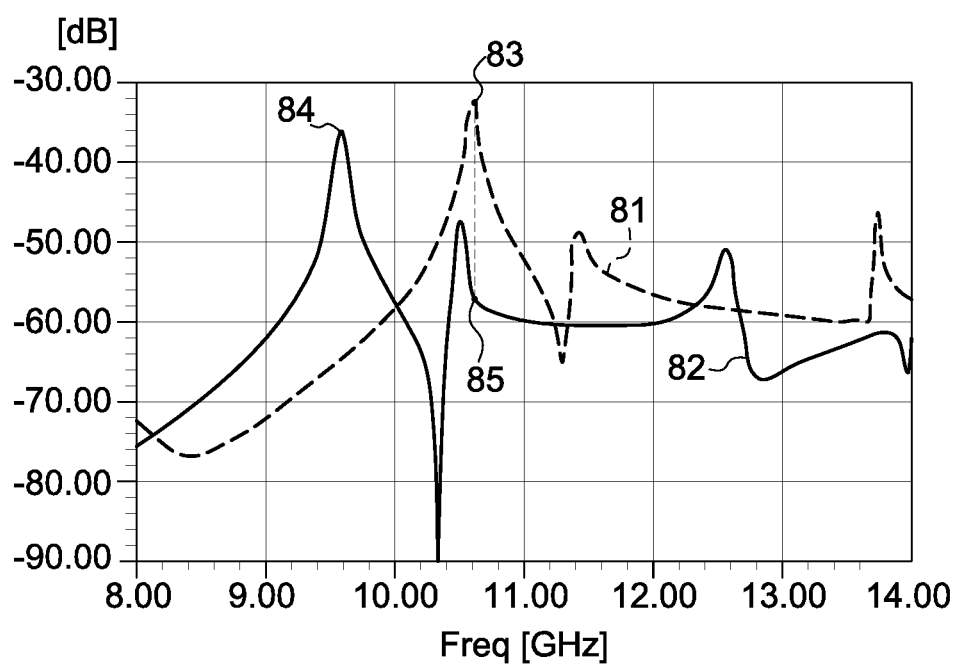
FIG. 8B plots frequency responses of different semiconductor device packages in accordance with embodiments of the present disclosure.

FIG. 8B plots frequency responses of different semiconductor device packages in accordance with embodiments of the present disclosure. A dotted line 81 represents a frequency response of the semiconductor device package 1' as shown in FIG. 1A, and a line 82 represents a frequency response of the semiconductor device package 2 as shown in FIG. 2 with the EMI shield 19 replaced by the EMI shield 19*h* of FIG. 8. A vertical axis of the plot in FIG. 8B represents coupling power of any two conductive lines/ports in a semiconductor device package; for example, coupling power of the input and the output of the power amplifier 131 of FIG. 2.

Referring to the dotted line 81, a peak 83 shows that the dotted line 81 has a relative maximum coupling power of approximately −32 dB at a frequency of approximately 10.58 GHz.

Referring to the line 82, a peak 84 shows that the line 82 has a relative maximum coupling power of approximately −36 dB at a frequency of approximately 9.5 GHz. The point 85 of the line 82 has a coupling power of approximately −57 dB at a frequency of approximately 10.58 GHz.

Comparing point 84 with point 83, the resonant frequency is shifted from approximately 10.58 GHz to approximately 9.5 GHz due to a structural change from the EMI shield 19' (FIG. 1A) to the EMI shield 19*h* (FIG. 8). When the semiconductor device package 1' (FIG. 1A) has a frequency of operation in the 5 GHz frequency band, noise included in signals may be resonated at approximately 10.58 GHz, which is in a frequency band that is a double of the 5 GHz frequency band (approximately 10.36 GHz to approximately 11.65 GHz). When the semiconductor device package 2 (FIG. 2) with the EMI shield 19*h* (FIG. 8) has a frequency of operation in the 5 GHz frequency band, noise included in signals may be resonated at approximately 9.5 GHz, which is outside of the frequency band that is double the 5 GHz frequency band.

Comparing point 85 with point 83, the coupling power is reduced from approximately −32 dB to approximately −57 dB at the frequency of approximately 10.58 GHz. When the semiconductor device package 1' (FIG. 1A) has a frequency of operation in the 5 GHz frequency band, the coupling power at approximately 10.58 GHz is approximately −32 dB. When the semiconductor device package 2 (FIG. 2) with EMI shield 19*h* (FIG. 8) has a frequency of operation in the 5 GHz frequency band, the coupling power at approximately 10.58 GHz is approximately −57 dB.

Figure 9A:
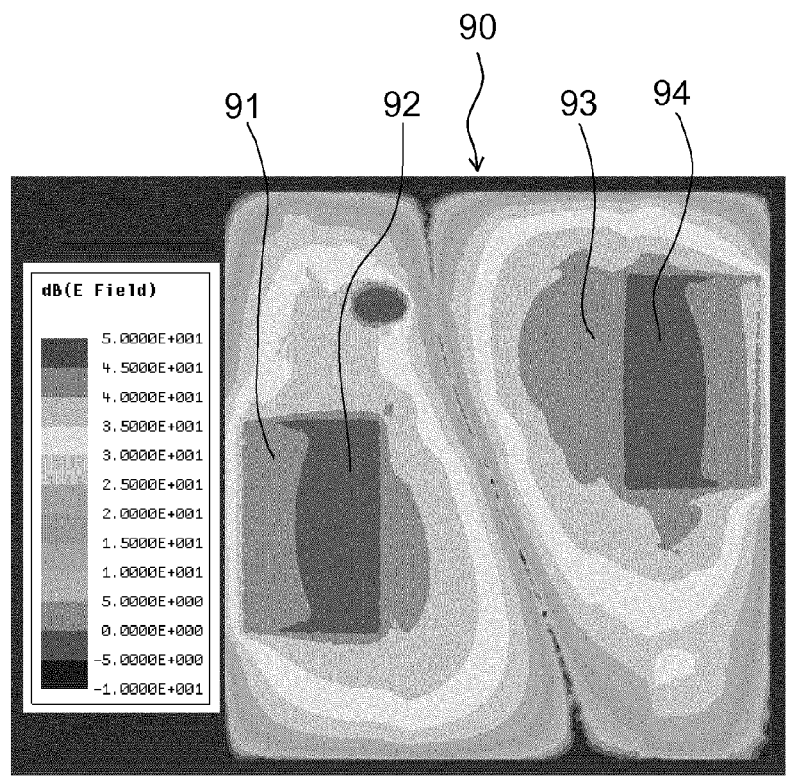
FIG. 9A illustrates a simulation result of a semiconductor device package in accordance with embodiments of the present disclosure.

FIG. 9A is a simulation result of a semiconductor device package in accordance with an embodiment of the present disclosure. A graph 90 shows electrical field strength distribution for the semiconductor device package 1' in FIG. 1A. Each of areas 91 and 93 of the graph 90 indicates an electrical field strength over 4.0×10=40 dB Volts per meter (dBV/m). Each of areas 92 and 94 of the graph 90 indicates electrical field strength over 4.5×10=45 dBV/m. The graph 90 shows regions having relatively high resonance in the semiconductor device package 1' of FIG. 1A, such as the areas 91, 92, 93 and 94.

Referring back to FIG. 1A, electrical field strength at or close to the joint of the side portions 191 and 192 of the EMI shield 19' may have a same or similar distribution to that of areas 91 and 92 as shown in FIG. 9A, while electrical field strength at or close to the joint of the side portions 193 and 194 of the EMI shield 19' may have a same or similar distribution to that of areas 93 and 94 as shown in FIG. 9A.

Figure 9B:
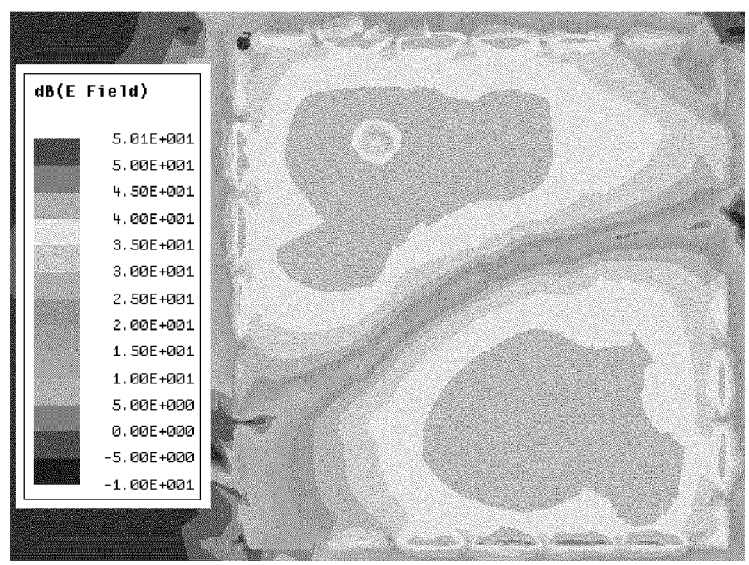
FIG. 9B illustrates a simulation result of a semiconductor device package in accordance with embodiments of the present disclosure.

FIG. 9B illustrates a simulation result of a semiconductor device package in accordance with an embodiment of the present disclosure. A graph 90' shows electrical field strength distribution for the semiconductor device package 2 as shown in FIG. 2 with openings 20, 21, 22, 20', 21' and 22' as shown in FIG. 5. Each area of the graph 90' indicates an electrical field strength of less than 4.5×10=45 dBV/m.

Referring back to FIG. 5, openings 20, 21 and 22 close to the joint of the side portions 191 and 192 of the EMI shield 19*e* and the openings 20', 21' and 22' close to the joint of the side portions 193 and 194 of the EMI shield 19*e* may contribute to a difference in electrical field strength distribution similar to the difference illustrated between FIG. 9A and FIG. 9B.

It is contemplated that simulation results of a semiconductor device package, similar to the simulation results of the semiconductor package 1' of FIG. 1A as shown in FIG. 9A, may be used to determine areas having relatively high resonance. When areas of relatively high resonance are determined, such as areas 91, 92, 93, and 94 in FIG. 9A, the position of these areas may be used to determine positions for openings (e.g., openings 20, 21, 22, 20', 21' and 22' in FIG. 5).

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

The term "substantially orthogonal" referring to two components can refer to a range of variation of less than or equal to ±10° of 90° between the two components, such as less than or equal to ±5°, less than or equal to ±3°, less than or equal to ±2°, or less than or equal to ±1°.

The term "at substantively a same elevation" referring to two or more components can refer to a distance of each of the components from a feature or a surface, where a difference in the distance with respect to the two or more components is less than or equal to ±10% of the distance of either component, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

A surface can be deemed to be substantially planar if a difference between a height of a highest point on the surface and a height of a lowest point on the surface is less than 0.5 µm, greater than 1 µm, greater than 2 µm, or greater than 5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "connect," "connected," and "connection" refer to an operational coupling or linking. Connected components can be directly or indirectly coupled to one another, for example, through another set of components.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package comprising:
   a substrate having a top surface and a lateral surface perpendicular to the top surface;
   at least one component on the top surface of the substrate;
   a package body encapsulating the at least one component and having a lateral surface; and
   an electromagnetic interference (EMI) shield conformally formed on the package body and covering the lateral surface of the package body, the EMI shield having a first side portion defining a first opening;
   wherein the lateral surface of the package body covered by the EMI shield is substantially coplanar with the lateral surface of the substrate,
   the at least one component is configured to operate at a frequency of operation, and the EMI shield having the first opening is configured to shift a resonant frequency that corresponds to the frequency of operation of the at least one component, and
   the first opening has a first length $L_1$ determined by $0.026\lambda \leq L_1 \leq 0.155\lambda$ and $\lambda$ is a wavelength related to the frequency of operation of the semiconductor device package, and the frequency of operation is in a range from approximately 5.180 GHz to approximately 5.825 GHz.

2. The semiconductor device package of claim 1, wherein the first opening has a height, wherein the first length $L_1$ is greater than the height.

3. The semiconductor device package of claim 1, wherein the first length $L_1$ is further determined by $0.029\lambda \leq L_1 \leq 0.139\lambda$.

4. The semiconductor device package of claim 1, wherein the EMI shield further defines a second opening on the first side portion, the second opening has a second length $L_2$, a sum $L_s$ of the first length $L_1$ and the second length $L_2$ is determined by $0.026\lambda < L_s \leq 0.155\lambda$.

5. The semiconductor device package of claim 1, wherein the EMI shield further defines a plurality of second openings on the first side portion, each of the plurality of second openings has a second length $L_2$, a sum $L_s$ of the first length $L_1$ and the second lengths $L_2$ is determined by $0.026\lambda < L_s \leq 0.155\lambda$ and $\lambda$ is a wavelength related to the frequency of operation of the semiconductor device package, and the frequency of operation is in a range from approximately 5.180 GHz to approximately 5.825 GHz.

6. The semiconductor device package of claim 1, wherein the EMI shield further comprises a second side portion connected to the first side portion, and the EMI shield further defines a second opening on the second side portion.

7. The semiconductor device package of claim 1, wherein the EMI shield further comprises a second side portion opposite the first side portion, and the EMI shield further defines a second opening on the second side portion.

8. The semiconductor device package of claim 1, wherein the EMI shield further comprises a second side portion connected to the first side portion, and the EMI shield further defines a second opening on the second side portion, wherein the first opening and the second opening are formed adjacent to a corner joined by the first side portion and the second side portion.

9. A semiconductor device package comprising:
   a substrate having a top surface and a lateral surface perpendicular to the top surface;
   a circuit on the top surface of the substrate, the circuit configured for operation at a first frequency;
   a package body encapsulating the circuit and having a lateral surface; and
   a conformal shield on the package body and covering the lateral surface of the package body, the conformal shield defining a first opening, wherein the conformal shield defining the first opening is configured to shift a resonant frequency that corresponds to the first frequency at which the circuit is configured for operation;
   wherein the lateral surface of the package body covered by the conformal shield is substantially coplanar with the lateral surface of the substrate, and
   the first opening has a first length $L_1$ determined by $0.026\lambda \leq L_1 \leq 0.155\lambda$ and $\lambda$ is a wavelength related to the frequency of operation of the semiconductor device package, and the frequency of operation is in a range from approximately 5.180 GHz to approximately 5.825 GHz.

10. The semiconductor device package of claim 9, the conformal shield comprising a first side portion defining the first opening.

11. The semiconductor device package of claim 10, the conformal shield comprising a second side defining a second opening.

12. The semiconductor device package of claim 9, wherein a position of the first opening is configured to reduce an electrical field strength in the semiconductor device package.

13. The semiconductor device package of claim 12, wherein the position is configured to shift the resonance frequency of the semiconductor device package.

14. The semiconductor device package of claim 9, wherein the first opening has a height, and the first length $L_1$ is greater than the height.

15. A semiconductor device package comprising:
a substrate having a top surface and a lateral surface perpendicular to the top surface;
at least one component on the top surface of the substrate;
a package body encapsulating the at least one component and having a lateral surface; and
an electromagnetic interference (EMI) shield conformally formed on the package body and covering the lateral surface of the package body, the EMI shield comprising an inductor structure;
wherein the lateral surface of the package body covered by the EMI shield is substantially coplanar with the lateral surface of the substrate;
the at least one component is configured to operate at a frequency of operation, and the EMI shield has at least one opening configured to shift a resonant frequency that corresponds to the frequency of operation of the at least one component, and
the at least one opening has a first length $L_1$ determined by $0.026\lambda \leq L_1 \leq 0.155\lambda$ and $\lambda$ is a wavelength related to the frequency of operation of the semiconductor device package, and the frequency of operation is in a range from approximately 5.180 GHz to approximately 5.825 GHz.

16. The semiconductor device package of claim 15, wherein the at least one opening is a first opening, and the inductor structure defines the first opening and a second opening adjacent to the first opening.

17. The semiconductor device package of claim 16, wherein the first opening has the first length, and the first opening and the second opening are separated by a wall portion having a second length, wherein the first length is greater the second length.

18. The semiconductor device package of claim 17, wherein a ratio of the first length to the second length is approximately one to approximately ten.

19. The semiconductor device package of claim 16, the EMI shield defines the opening at a side of the semiconductor device package.

* * * * *